(12) United States Patent
Chang-Hasnain et al.

(10) Patent No.: US 8,488,646 B2
(45) Date of Patent: Jul. 16, 2013

(54) HCG REFLECTION ENHANCEMENT IN DIVERSE REFRACTIVE INDEX MATERIAL

(75) Inventors: Connie Chang-Hasnain, Palo Alto, CA (US); Christopher Chase, Kensington, CA (US); Vadim Karagodsky, Berkeley, CA (US); Igor Karagodsy, legal representative, Brighton, MA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/593,375

(22) Filed: Aug. 23, 2012

(65) Prior Publication Data

US 2013/0051419 A1 Feb. 28, 2013

Related U.S. Application Data

(63) Continuation of application No. PCT/US2011/026110, filed on Feb. 24, 2011.

(60) Provisional application No. 61/307,843, filed on Feb. 24, 2010.

(51) Int. Cl.
*H01S 5/00* (2006.01)

(52) U.S. Cl.
USPC .................. 372/50.11; 372/45.01; 372/50.1; 372/50.124; 359/558; 359/563; 359/566; 359/569; 359/572; 359/573; 359/575

(58) Field of Classification Search
USPC .......... 372/45.01, 43.01, 50.1, 50.11, 50.124; 359/485.05, 558–576
See application file for complete search history.

(56) References Cited

U.S. PATENT DOCUMENTS

| | | | | |
|---|---|---|---|---|
| 6,233,087 B1 * | 5/2001 | Hawkins et al. | | 359/290 |
| 6,754,006 B2 * | 6/2004 | Barton et al. | | 359/569 |
| 6,829,092 B2 * | 12/2004 | Amm et al. | | 359/573 |
| 7,057,819 B1 | 6/2006 | Maheshwari | | |
| 8,059,690 B2 * | 11/2011 | Chang-Hasnain et al. | | 372/50.124 |
| 8,098,430 B2 * | 1/2012 | Iizuka et al. | | 359/569 |

(Continued)

FOREIGN PATENT DOCUMENTS

| | | |
|---|---|---|
| JP | 2002-214420 A | 7/2002 |
| KR | 10-0632548 B1 | 10/2006 |
| KR | 10-0779693 B1 | 11/2007 |

OTHER PUBLICATIONS

Connie J. Chang-Hasnain and Weijian Yang, "High contrast grating for intergrated optoelectronic" Advance in Optics and Photonics Sep. 4, 2012, pp. 379-440.*

(Continued)

*Primary Examiner* — Jessica Stultz
*Assistant Examiner* — Delma R Forde
(74) *Attorney, Agent, or Firm* — John P. O'Banion

(57) ABSTRACT

Enhanced reflectivity High-Contrast Gratings are described which operate in different medium. An HCG is described with a deep/buried metallization layer separated at a distance of least three to four grating thicknesses from the grating. Reflective bandwidth of the HCG is substantially increased, such as by a factor or five, by inclusion of the deep/buried metallization layer. An HCG is described which provides high reflectivity, even when embedded into materials of a moderate to high index of refraction, such as semiconductor material. Vertical cavity surface emitting laser embodiments are described which utilize these reflectivity enhancements, and preferably utilize HCG reflectors for top and/or bottom mirrors.

25 Claims, 23 Drawing Sheets

U.S. PATENT DOCUMENTS

| | | | |
|---|---|---|---|
| 2009/0059375 A1* | 3/2009 | Hoose | 359/572 |
| 2011/0255390 A1* | 10/2011 | Hirai | 369/100 |
| 2011/0280269 A1* | 11/2011 | Chang-Hasnain et al. | 372/50.1 |
| 2011/0280533 A1* | 11/2011 | Chang-Hasnain et al. | 385/131 |
| 2012/0128019 A1* | 5/2012 | Chang-Hasnain et al. | 372/45.01 |
| 2012/0224263 A1* | 9/2012 | Gallagher | 359/570 |
| 2013/0051410 A1* | 2/2013 | Chang-Hasnain et al. | 372/11 |
| 2013/0058370 A1* | 3/2013 | Chang-Hasnain et al. | 372/50.11 |

OTHER PUBLICATIONS

Christopher Chase, "High contrast grating VCSELs: properties and implementation on InP-based VCSELs" Electrical Engineering and computer sciences university of California at Berkeley, May 10, 2011, pp. 1-126.*

Christopher Chase et al. "1550 nm high contrast grating VCSEL" Electrical Engineering and computer sciences university of California at Berkeley, Jul. 19, 2010, col. 18, No. 15/ Optics Express pp. 1-6.*

Korean Intellectual Property Office (KIPO), International Search Report and Written Opinion issued on Nov. 25, 2011 (pp. 1-9), including claims searched (pp. 10-15), related PCT International Application PCT/US2011/026110, pp. 1-15.

* cited by examiner

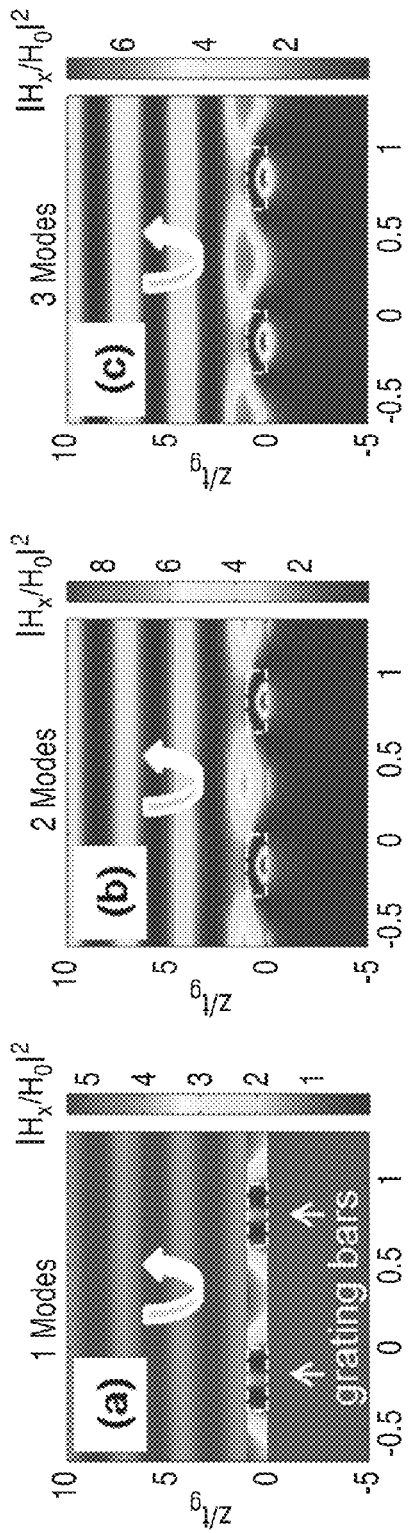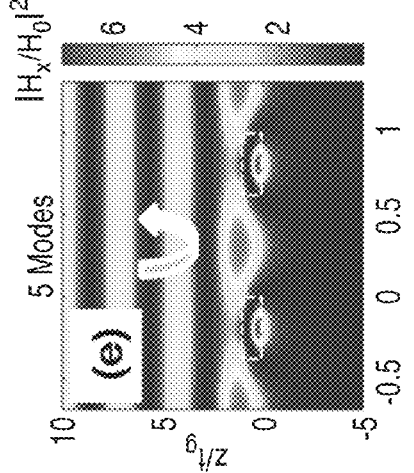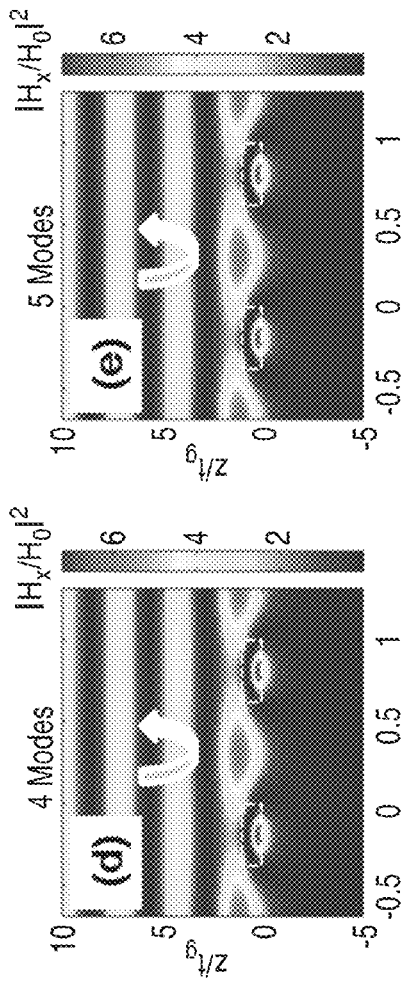
FIG. 7A  FIG. 7B  FIG. 7C  FIG. 7D  FIG. 7E

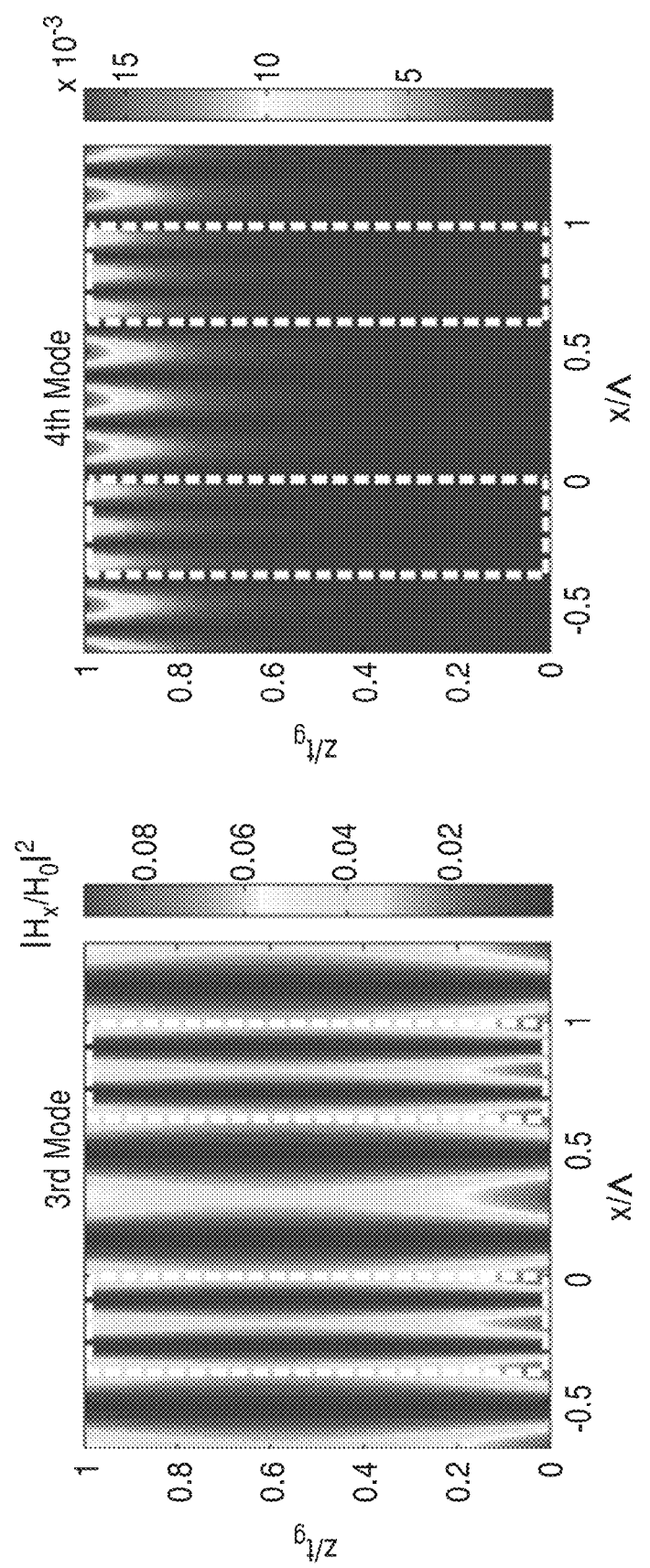

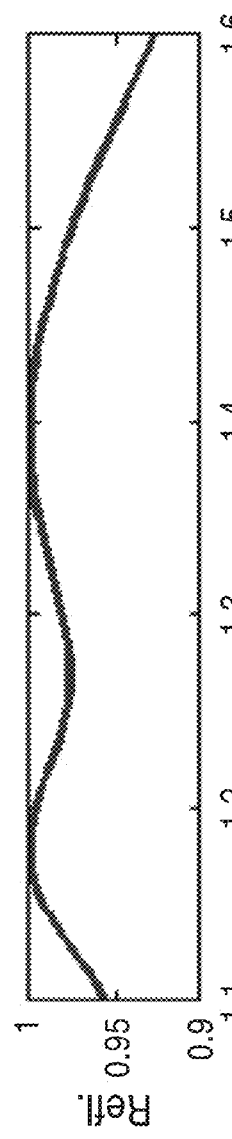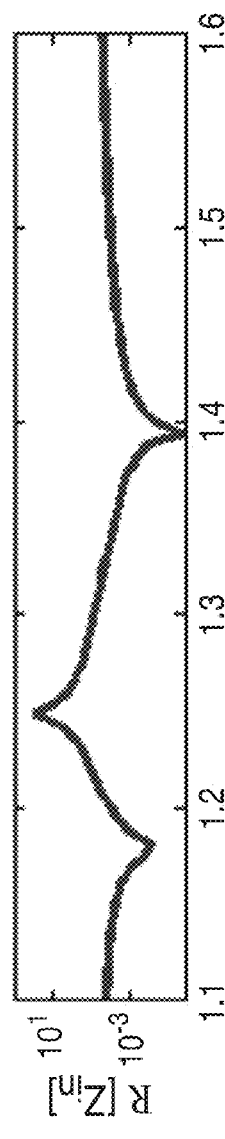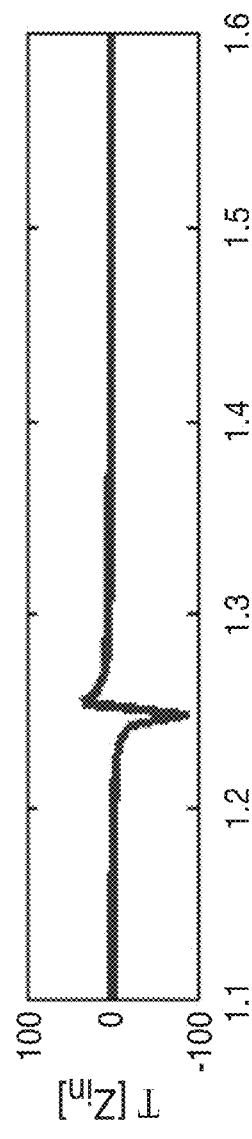

HCG REFLECTION ENHANCEMENT IN DIVERSE REFRACTIVE INDEX MATERIAL

CROSS-REFERENCE TO RELATED APPLICATIONS

This application is a 35 U.S.C. §111(a) continuation of PCT international application number PCT/US2011/026110 filed on Feb. 24, 2011, incorporated herein by reference in its entirety, which is a nonprovisional of U.S. provisional patent application Ser. No. 61/307,843 filed on Feb. 24, 2010, incorporated herein by reference in its entirety. Priority is claimed to each of the foregoing applications.

The above-referenced PCT international application was published as PCT International Publication No. WO 2011/106551 on Sep. 1, 2011 and republished on Jan. 19, 2012, and is incorporated herein by reference in its entirety.

STATEMENT REGARDING FEDERALLY SPONSORED RESEARCH OR DEVELOPMENT

This invention was made with Government support under Grant No. N00244-09-1-0013 awarded by the Department of Defense, and Grant No. Y503161 awarded by the National Science Foundation. The Government has certain rights in this invention.

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to high-contrast gratings, and more particularly to enhanced reflectivity in sub-wavelength high-contrast gratings (HCGs).

2. Description of Related Art

Subwavelength high-contrast gratings, having a high refractive index material surrounded by low index material, have been shown to be extremely effective as a highly reflective, broadband mirror with many beneficial properties. A single layer of HCG proves to be as good a mirror as a 40-layer distributed Bragg reflector (DBR). Application can be made of these devices in numerous applications, such as within VCSELs to replace the top DBR mirror while selecting a preferred lasing polarization. The inventors have shown these devices also can provide a high-Q resonator, for mirror sidewalls of a hollow waveguide, and are particularly well-suited for MEMS-based applications because of their small size.

Despite the numerous advantages of HCG, further benefits could be derived by improving their responses, such as increasing reflectivity. In addition, the necessity of surrounding the HCG with low refractive index materials in certain applications is problematic. For example, the bottom mirror of a VCSEL is typically embedded within relatively high refractive index semiconducting materials, due to electrical and thermal conductivity considerations.

Accordingly, improving HCG mirror characteristics would benefit numerous applications. The present invention teaches inventive embodiments which increase the reflectivity of sub-wavelength high-contrast gratings, and allow integration of HCG reflectors in a wider range of applications.

BRIEF SUMMARY OF THE INVENTION

Apparatus are described for enhancing HCG properties and increasing their applicability to diverse applications. An enhanced reflectivity HCG is described which improves surface-normal and glancing-angle reflective properties of a sub-wavelength high-contrast grating (HCG), in response to inclusion of a buried/distant metal film layer. In addition another HCG enhancement is an "inverse-tone" HCG which provides the desired reflective properties while embedding the grating within adjacent layers of moderate to high index materials. This "inverse-tone" HCG embedded in high index environments still provides reflectivity well above 99%.

The invention is amenable to being embodied in a number of ways, including but not limited to the following descriptions.

One embodiment of the invention is an apparatus for optical reflection, comprising: (a) a high-contrast grating (HCG) having grating elements spaced apart from one another at a grating thickness, width and subwavelength period spacing to provide a desired level of reflectance; (b) an adjacent material layer of a sufficient depth in relation to operating wavelength, refractive index of the adjacent material layer, and period of the high-contrast grating; and (c) a metallic layer, adjacent the deep layer, having a sufficient thickness to provide desired reflection enhancement to the high contrast grating; (d) the high-contrast grating elements have an index of refraction which differs from the material between the grating elements by at least one.

At least one embodiment of the invention is configured wherein material above, below and between the grating elements (grating bars) need not be of the same material. At least one embodiment of the invention is configured so that the sufficient depth of the adjacent material layer is given by the following relation:

$$\text{Sufficient Depth} > \left[\frac{\lambda}{2\pi}\right] / \left[\left(\frac{\lambda}{\Lambda}\right)^2 - n_r^2\right]^{1/2}$$

where $\lambda$ is the wavelength, $n_r$ is the refractive index of the dielectric, and $\Lambda$ is the grating period. At least one embodiment of the invention is configured with the metallic layer having a thickness which equals or exceeds optical skin depth for the material utilized in the metallic layer. At least one embodiment of the invention is configured with a planar high-contrast grating. At least one embodiment of the invention is configured with the high contrast grating (HCG) with subwavelength grating having a period $\Lambda$ which is less than the operating wavelength $\lambda$ in the material above or below the grating. At least one embodiment of the invention is configured with the metallic layer comprises a layer of Au, Ag, Pt, Pd, Ti, Al, Cu, In, Ni, Zn, Sn, other reflective metals, and combinations thereof. At least one embodiment of the invention the metallic layer is comprises a layer of at least, a thickness of 2 nm. At least one embodiment of the invention is configured with grating elements that are straight and/or curved parallel bars of material. At least one embodiment of the invention is configured with the grating elements having a high index of refraction at or above 2, or more preferably 2.5, or most preferably above 3, while the adjacent material layer is of low index material with an index of refraction below 2. At least one embodiment of the invention is configured with the high-contrast grating comprising an inverse-tone grating which does not rely on an internal high contrast between the grating elements and the adjacent material layer above and below and compensates for reduced index contrast by relying on initial reflection enhancement upon wave incidence caused by index discontinuity at a transition from the materials above and below the high-contrast grating.

At least one embodiment of the invention is configured with the inverse-tone grating comprising grating elements having a refractive index at or above approximately two, spaces between the grating elements having a low refractive index of approximately one, and an adjacent material layer of a medium to high index material having an index of refraction between two and three, which is less than the refractive index of the grating elements.

One embodiment of the invention is an apparatus for optical reflection, comprising: (a) a high-contrast grating (HCG) which is planar; (b) grating elements within the high contrast grating having a grating thickness and width, in which the grating elements are spaced apart from one another with a period, which is subwavelength in the material above and below, to provide reflectance at the desired wavelength; (c) adjacent material layers with medium to high refractive index, in which the high-contrast grating (HCG) is an inverse-tone high contrast grating in response to selection of the grating thickness, and width as well as material of the grating elements and adjacent material layers; the inverse-tone grating does not rely on internal high contrast between the grating elements and the material layers above and below the high-contrast grating (HCG) and compensates for reduced index contrast by relying on initial reflection enhancement upon wave incidence caused by double index discontinuity at a transition from the adjacent material to the grating elements; the grating elements have a high index of refraction $n_{bar}$ at or above approximately two, and are separated by spaces having an index of refraction which is below two; the adjacent material comprises medium to high index material having an index of refraction $n_{out}$ of at least 1.8; wherein the refractive index of the grating elements and adjacent material follows the relation, $$n_{out} < \frac{\lambda}{\Lambda} < n_{bar},$$

where $\lambda/\Lambda$ is the ratio between a wavelength of operation for the apparatus and grating period.

One embodiment of the invention is a vertical cavity surface emitting laser (VCSEL), comprising: (a) a top mirror; (b) an active region comprising quantum structures; (c) a cavity region surrounding the active region; (d) a high-contrast grating (HCG) having grating elements spaced apart from one another at a grating thickness, width and subwavelength period spacing to provide a desired level of reflectance at the operating wavelength; wherein the high-contrast grating is disposed on opposing sides of the cavity region; (e) an adjacent material layer of a depth of sufficient depth in relation to an operating wavelength, a refractive index of the adjacent material layer, and period of the high-contrast grating; and a metallic layer disposed on the adjacent material layer, and of a sufficient thickness to provide desired reflection enhancement to the second high contrast grating.

The present invention provides a number of beneficial elements which can be implemented either separately or in any desired combination without departing from the present teachings.

An element of the invention is a method and apparatus for enhancing reflectivity of a high-contrast grating (HCG) for surface-normal and glancing-angle incident light.

Another element of the invention is an HCG whose reflection is enhanced by incorporation of a deep layer followed by a metallic layer on the backside of the grating.

Another element of the invention is inclusion of a deep layer whose depth is determined by operating wavelength and the dimensions of the HCG.

Another element of the invention is the use of a low refractive index material for said deep layer.

Another element of the invention is the use of one or more metals, such as gold (Au) or silver (Ag), or any other reflective metal or combination therefore for the buried metallic layer.

Another element of the invention is the ability to multiply reflectivity bandwidth by approximately five, in response to addition of the buried/deep metallization layer.

Another element of the invention is the ability to utilize an inverse-tone HCG as a reflector, even within a material having a moderate to high refractive index, such as semiconductor materials.

Another element of the invention is an inverse-tone HCG which compensates for reduced index contrast by relying on initial reflection enhancement upon wave incidence caused by double index discontinuity at a transition from said adjacent material to said grating elements.

Another element of the invention is wherein said refractive index of the grating elements and adjacent material follows the relation, $$n_{out} < \frac{\lambda}{\Lambda} < n_{bar},$$

where $\lambda/\Lambda$ is the ratio between a wavelength of operation for said apparatus and grating period Another element of the invention is a vertical cavity surface emitting laser structure which incorporates one the buried/deep metallic layer and/or the inverse-tone HCG.

A still further element of the invention is the ability to conventionally fabricate these enhanced HCG structures.

Further elements of the invention will be brought out in the following portions of the specification, wherein the detailed description is for the purpose of fully disclosing preferred embodiments of the invention without placing limitations thereon.

BRIEF DESCRIPTION OF THE SEVERAL
VIEWS OF THE DRAWING(S)

The invention will be more fully understood by reference to the following drawings which are for illustrative purposes only:

FIG. 7A through FIG. 7E are intensity profiles showing convergence as a function of the number of modes.

FIG. 8A through FIG. 8D are contour plots of modes within the HCG.

FIG. 10A through FIG. 10C are graphs of reflectivity spectrum and normalized impedance encountered by the incident plane wave.

DETAILED DESCRIPTION OF THE INVENTION

1. Theoretical Analysis of Grating Reflectivity

The following sections provide an analysis of grating reflectivity that will aid in understanding the techniques and embodiments of the present invention. For the sake of simplicity, the analysis is limited to the case of surface-normal incidence and a rectangular profile of refractive index, although the inventive aspects are not limited in this regard.

Figure 1:
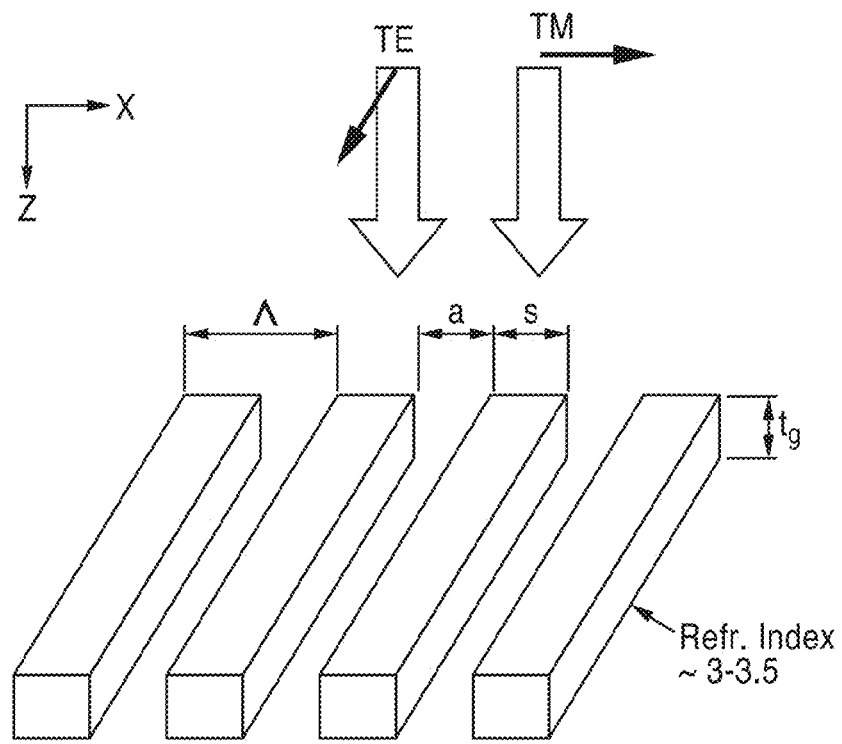
FIG. 1 is a schematic of a high-contrast grating, showing incident optical waves in two different polarizations.

FIG. 1 depicts geometry for a High Contrast Grating (HCG), shown with upper outline arrows indicating the wave incidence direction, and from which the medium size arrows are shown in relation thereto representing E-field direction illustrating both Transverse-Magnetic (TM) and Transverse Electric (TE) polarizations. The period ($\Lambda$) of the gratings is shown in the figure, along with bar width (s), thickness ($t_g$), and air-gap (a).

The parallel bars represent a dielectric material with a refractive index ($\theta_r$), which is significantly higher than the refractive index of the surrounding medium, wherefrom the phrase arises "High-Contrast" Grating (HCG). The typical refractive index of the high-index grating bars is 3~3.5, and the outside medium is assumed to be a low refractive material or air ($\eta_r$=1). It should be appreciated that numerous low index media exist (e.g., oxides), which provide comparable effects and refractive indices which are less than two (2), and more preferably approximately one (1). The grating periodicity direction is depicted as x, with the incident plane wave propagation direction depicted as z indicated by the large upper arrows. For simplicity, the length of each grating bar is assumed to be infinite in y direction (coming out of the page) and infinitely periodic in x direction.

Two polarizations are considered in the analysis: (i) Transverse-Magnetic (TM), in which the electric field is in the x direction; (ii) Transverse Electric (TE), in which the electric field is in y direction. Both polarizations are represented in the figure which are labeled and superposed over the wave incidence direction.

Figure 2:
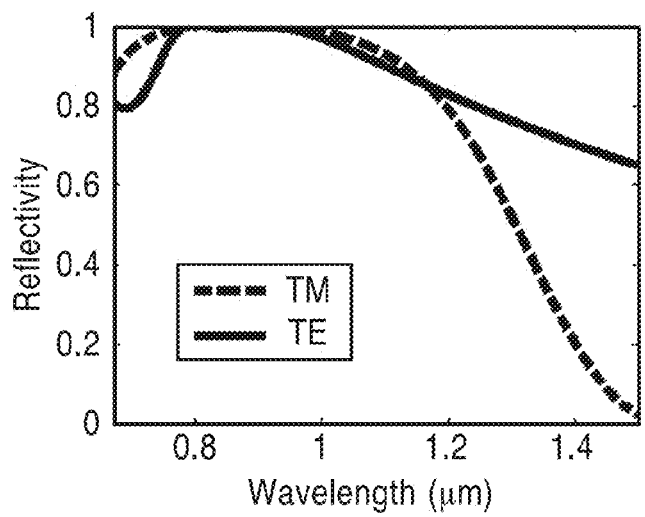
FIG. 2 is a graph of reflectivity as a function of wavelength for the two polarization directions.

FIG. 2 depicts an example of the broad-band high reflectivity provided by the HCG structure for both polarizations. By way of example, the parameters for TM polarization for this specific embodiment are: $\theta_r$=3.21, $\Lambda$=0.44 µm, s/$\Lambda$=0.77, $t_g$=0.29 µm. The parameters for use with a specific embodiment having TE polarization are: $\theta_r$=3.3, $\Lambda$=0.64 µm, s/$\Lambda$=0.38, $t_g$=0.14 µm.

Figure 3:
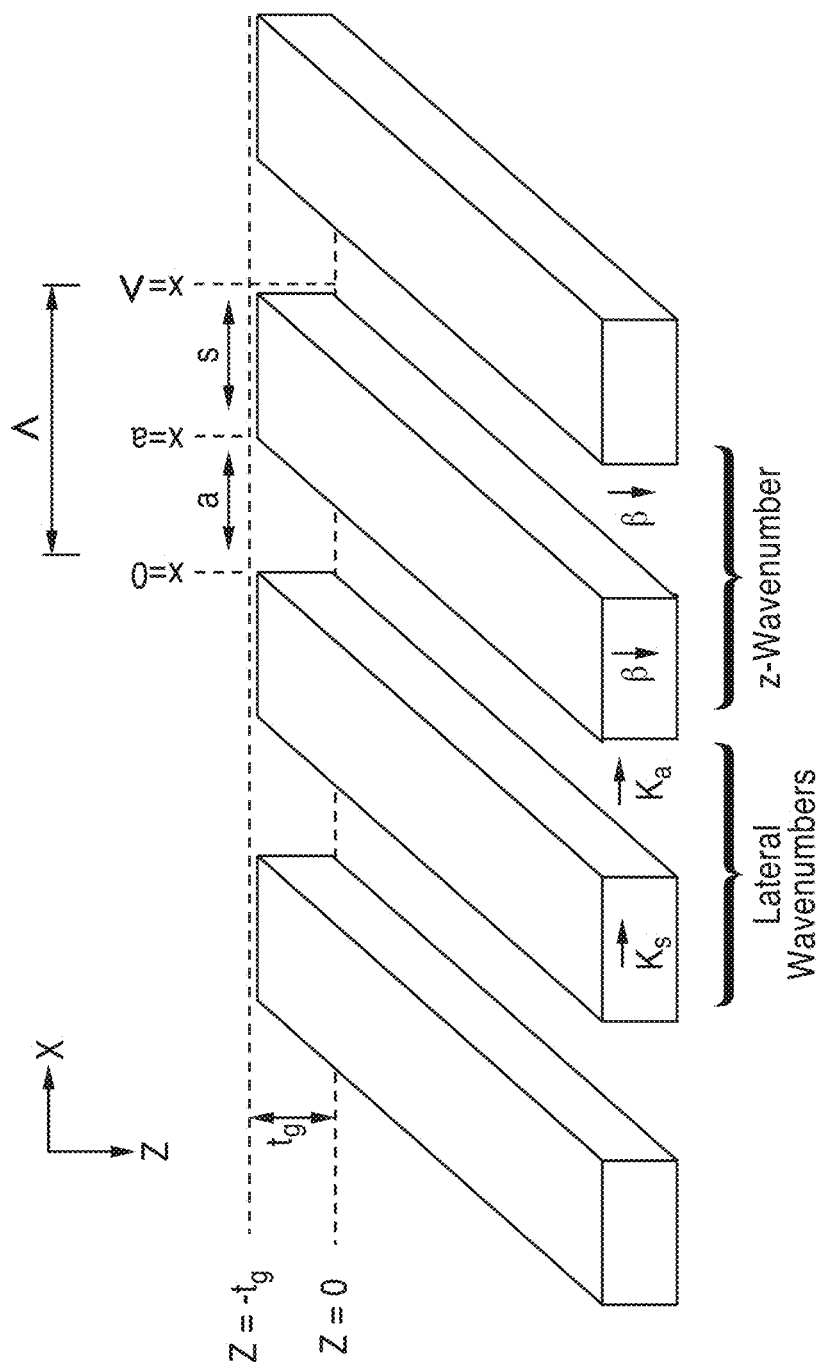
FIG. 3 is a schematic of a high-contrast grating, showing lateral and z wavenumbers in relation to grating dimensions.
Figure 4:
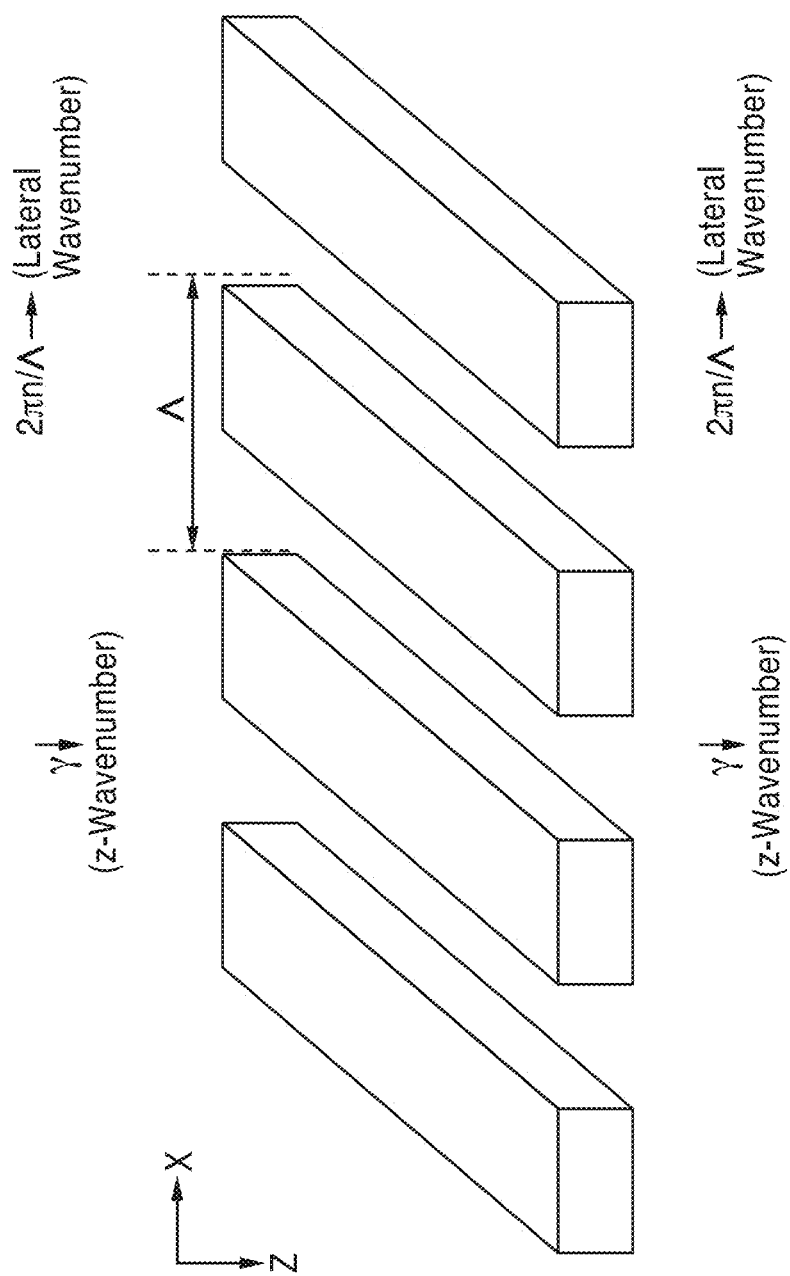
FIG. 4 is a schematic of a high-contrast grating, showing lateral and z wavenumbers in relation to grating period.

FIG. 3 and FIG. 4 depict gratings with reference indicia describing the nomenclature for all wavenumbers, axes and dimensions, and referring to mode formulations both inside and outside of the high-contrast grating (HCG). Lateral and z-wavenumbers are seen depicted in the figures along with period, grating thickness and other parameters.

Upon wave incidence, reflected and transmitted modes are generated at the grating, the lowest of which are plane waves. These elements are described in Table 1, at the end of the specification, along with their associated mathematical formulations. The mode profiles in Eq. 1 and Eq. 2 of Table 1 describe the lateral (x) field components: electric field $E_x$ in the TM case, and magnetic field $H_x$ in the TE case. The formulation of the y and z field components are not described herein, as they can be readily derived from the components. Since the HCG is considered infinite in y direction and the incidence is surface normal, the solution described in Table 1 is two-dimensional ($\delta/\delta y$). In addition, the solution is described for only one HCG period (0<x<$\Lambda$), since all modes are periodic in x direction. As the plane wave incidence is surface normal, there is no preferred direction among +x and –x, wherefore modes in Eqs. 1, 2, 4 and 5, have a standing wave (cosine) lateral profile. Eq. 1 and Eq. 2 show that the mode profiles have two sets of symmetry planes: each air-gap center (x=a/2) and each grating bar center (x=a+s/2). The same is of course true for the modes outside HCG, seen in Eq. 4 and Eq. 5. While the symmetry plane (x=a/2) outside HCG is obvious from Eq. 4 and Eq. 5, the following identity helps to demonstrate that (x=a+s/2) is a symmetry plane as well:

$$\cos[2\pi n(x-a/2)/\Lambda] = (-1)^n \cos\{2\pi n[x-(a+s/2)]/\Lambda\}.$$

The lateral symmetry in Eq. 1 and Eq. 2 and Eq. 4 and Eq. 5 is even (cosine) rather than odd (sine), because the incident plane wave has a laterally constant profile, and thus it can only excite cosine harmonics.

In Eq. 6 through Eq. 9 of Table 1 and Table 2 the dispersion relations are listed between the different wave numbers, while Eq. 9 describes the x-wavenumbers outside the grating ($\gamma_n$). Eq. 9 shows that the HCG, as expected, has only the zeroeth diffraction order: $\gamma_0 = 2\pi/\lambda$, while all higher orders are evanescent ($\gamma_n$ is imaginary), since HCG is subwavelength ($\Lambda/\lambda < 1$). This fact is essential for the design of high reflectivity gratings, since high reflectivity is achieved by cancelling the zeroeth-transmissive order. It should be appreciated that higher evanescent orders do not carry power and thus do not require cancellation. Had there been more than one transmissive order, it would not be possible to obtain a high reflectivity grating.

Figure 5:
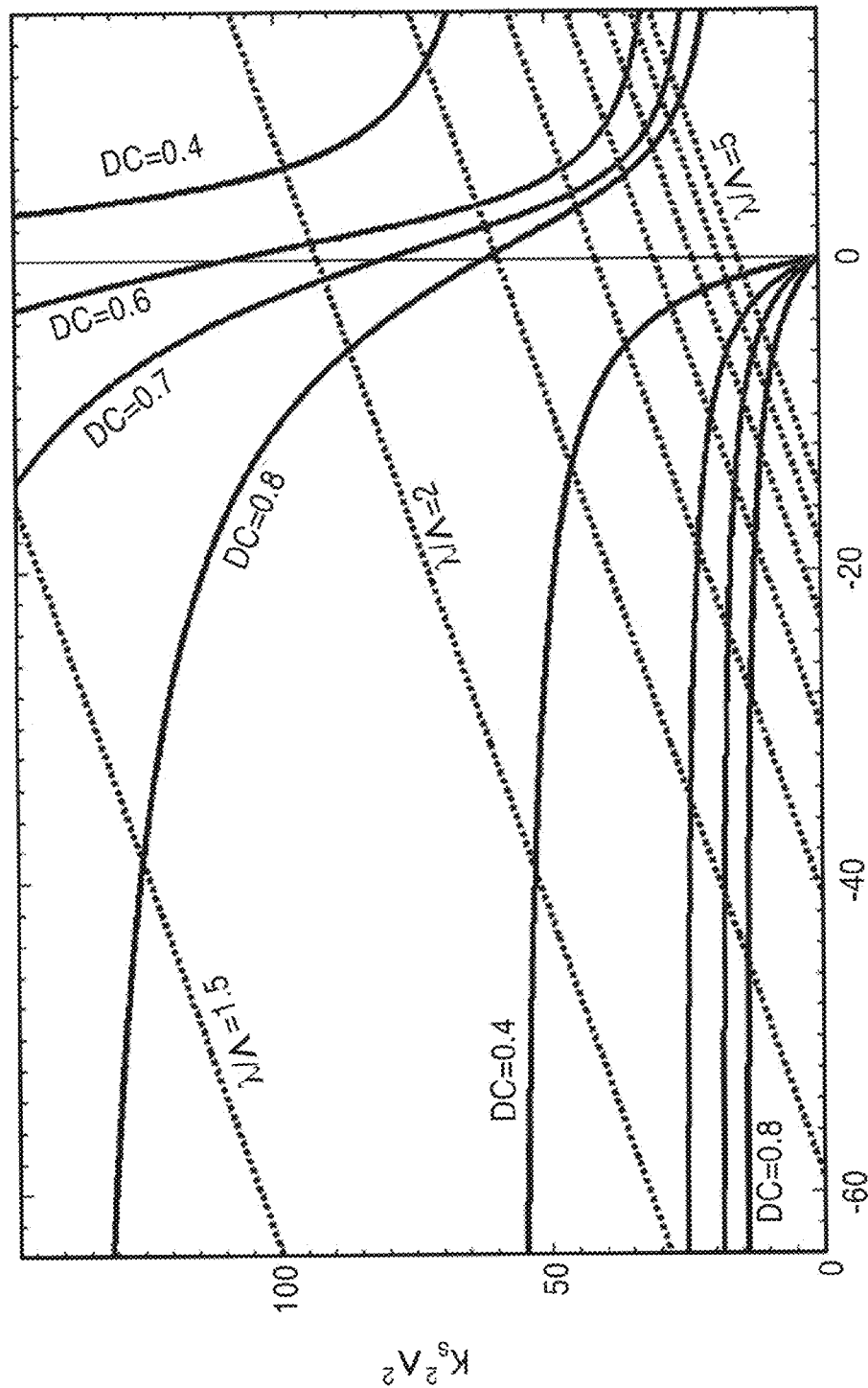
FIG. 5 is a graph of dispersion for an HCG with a given refractive index.

FIG. 5 depicts the dispersion relations for Eq. 6 through Eq. 8 in Table 1 for various grating duty cycles (DC), defined as DC=s/$\Lambda$, shown as DC=0.4, 0.5, 0.6, 0.7 and 0.8. These dispersion relations are shown for an HCG with a refractive index $n_r$=3.21, assuming TM polarization. Lower and upper curves represent the first two branches of Eq. 8. The intersection between the linear lines and the transcendental curves denote the -wavenumbers of each mode. The linear lines in the figure correspond to subtracting Eq. 7 from Eq. 6. It will be seen that at large wavelengths ($\lambda \gg \Lambda$) the lowest harmonic resembles a plane wave $k_s \approx k_a \approx 0$, since at large wavelengths the exact grating profile loses effect, and the grating behaves as a uniform layer with an effective refractive index.

The figure shows that inside the grating bars all modes have real wavenumbers $k_s$, while inside the air-gaps the lowest mode has an imaginary wavenumber $k_a$ and the higher modes have either imaginary or real $k_a$, depending on wavelength. Another intuitive observation from FIG. 5 is that at large wavelengths ($\lambda \gg \Lambda$) the lowest harmonic resembles a plane wave ($k_s \approx k_a \approx 0$), since at large wavelengths the exact grating profile loses effect, and the grating behaves as a uniform layer with an effective refractive index.

Based on the mode profiles of Table 1, the calculation of the HCG reflectivity is shown in Table 2. The method adopted in Table 2 borrows the reflection coefficient calculations of transmission lines, with the significant difference that in the multi-mode case of HCG, matrices replace scalars. The solution in Table 2 depends entirely on overlaps between mode profiles inside the HCG (Eq. 1 and Eq. 2) and those outside the HCG (Eq. 3 and Eq. 5). Initially, two unit-less matrices are defined: the E and H matrices respectively indicate the overlaps between the electric field profiles inside and outside HCG and the magnetic field profiles. This definition of E and H is insightful, since the entire HCG solution can be based on those two matrices.

As a second step, an intuitive expression is used in Eq. 12 to calculate the reflection matrix $\rho$, which describes the bouncing of the HCG modes from the HCG output planes (i.e., z=0 and z=-$t_g$) back into the grating. This reflection matrix is typically non-diagonal, which means that the modes couple into each other during the back-bouncing. This does not contradict the orthogonality of the modes inside HCG, since the back-bouncing involves interaction with the modes outside HCG, which are not orthogonal to the modes inside the HCG.

In regular transmission lines, the reflectivity calculation is also based on the accumulated phase, which is represented herein by the phase matrix $\phi$, defined in Eq. 13, as a diagonal matrix comprising individual phases of each mode. Having defined the reflection and the phase matrices, which are the matrix analogies of the corresponding scalars in transmission line theory, the transmission line solution steps are followed to define the (normalized) entrance impedance matrix of the HCG, $Z_{in}$, as shown in Eq. 14. Then by knowing $Z_{in}$, the reflectivity matrix R of the HCG is calculated by Eq. 15, whereby the coefficient of interest is $R_{00}$, which is the reflectivity of the incident plane-wave.

Figure 6:
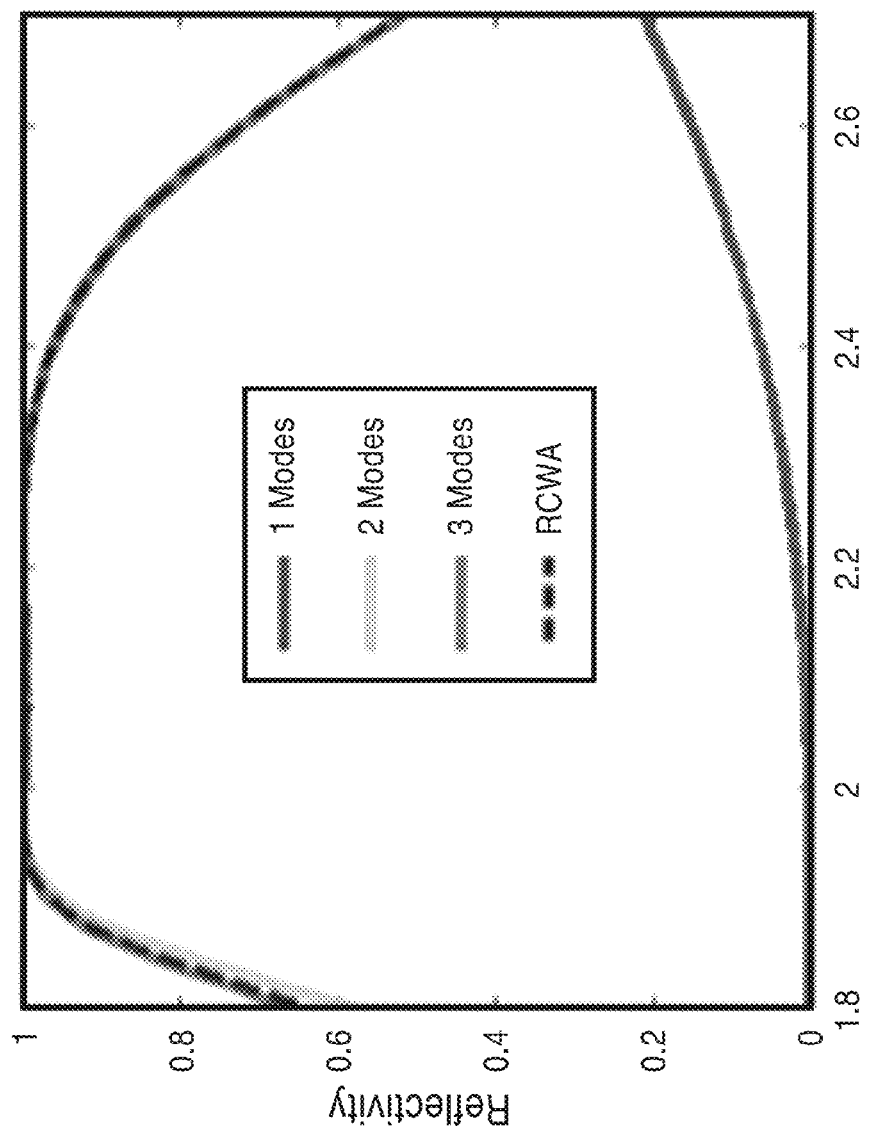
FIG. 6 is a graph of convergence of the analytical solution found in Tables 1 and 2 towards the RCWA simulation.
Figure 8B:
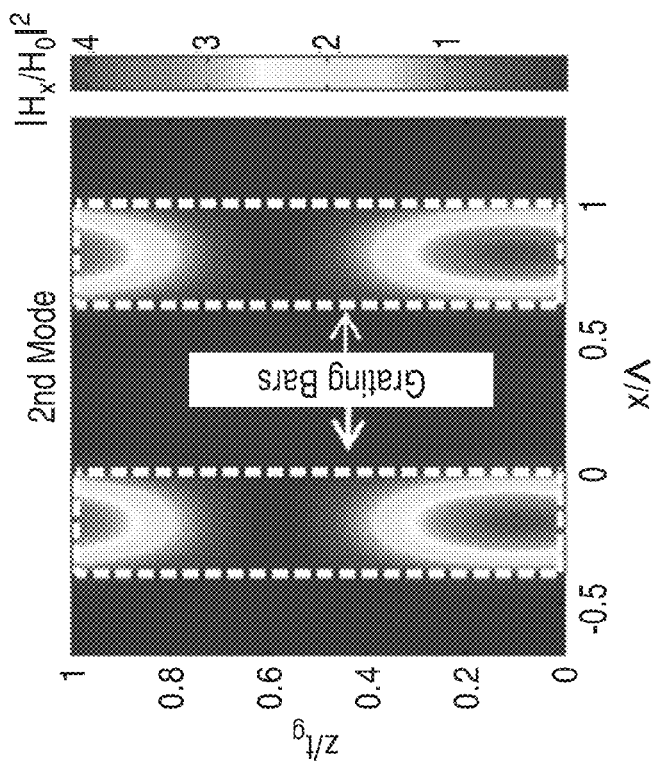
Figure 8A:
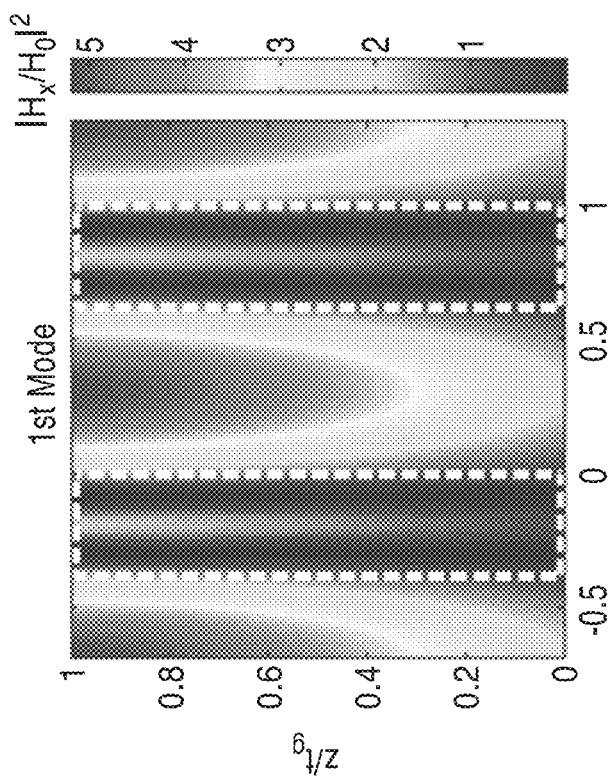

FIG. 6 depicts convergence of the analytical solution in Table 1 and Table 2 towards the Rigorous Coupled Wave Analysis (RCWA) simulation result as a function of the number of modes taken into consideration for TE polarization. Due to the inherent multimode nature of the HCG, the single mode solution is far from the RCWA result, but as soon as at least one more mode is added, the convergence becomes almost perfect as seen in the figure.

The next step is to determine how many modes in Table 1 and Table 2 are actually required to obtain the desired precision, in particular the rate at which the solution converges. A clear conclusion from FIG. 6 is that the two lowest modes are already sufficient to describe reflectivity with very high precision. However, a solution based on only one mode generates a result, which has nothing in common with the final solution. This agrees with the underlying principle of this work, which is the multi-mode nature of the HCG. A further examination of solution convergence is described below.

FIG. 7A through FIG. 7E depict convergence with respect to intensity profiles provided by the solution in Table 1 and Table 2 which are shown as a function of the number of modes taken into consideration. The grating bars are marked by the white dashed squares. When four or more modes are utilized, the boundary condition matching is almost perfect. The high reflectivity is clearly demonstrated by the standing wave profile created by the incident and reflected plane waves above the HCG. It will be seen in the figures that accuracy increases in response to increasing the number of modes taken into account from one in FIG. 7A to five in FIG. 7E. A single mode solution, as expected, is not enough to satisfy the boundary conditions at the HCG output planes (z=$t_g$ and z=0), while a two mode solution is already comes close to the final result. However, while a two mode solution is sufficient in terms of reflectivity, as shown in FIG. 6, it is still lacks precision in regards to its boundary condition matching, as seen in FIG. 7A through FIG. 7E, which requires four modes.

FIG. 8A through FIG. 8D depict separate contour plots for each mode inside the HCG, whose grating bars are marked by white dashed squares. The first mode is shown to exist principally in the air-gaps, while the second mode has a comparable intensity and is shown mainly within the area of the grating bars. The third mode is a surface wave, evanescently decaying into the grating with an intensity approximately fifty (50) times smaller than the first two modes.

1.1 Two-Port Circuit Analogy.

The immediate benefit of the transmission line formulation described in Table 1 and Table 2 is that the reflectivity phenomena discussed above can be approached in terms of widely used transmission-line impedance terminology, with the significant difference that the impedance according to the present invention is a matrix. In microwave theory, circuits described by matrix impedances are called multi-port circuits. The present invention extends an analogy between the multiple modes excited by the incident plane wave to a multiple-port circuit, characterized by an impedance matrix $Z_{in}$, given in Eq. 14, such that each mode corresponds to a circuit port. The prevalence of the first two modes, demonstrated in FIG. 6, makes it reasonable to limit the discussion to a two-port circuit and analyze its 100% reflectivity condition.

Figure 9:
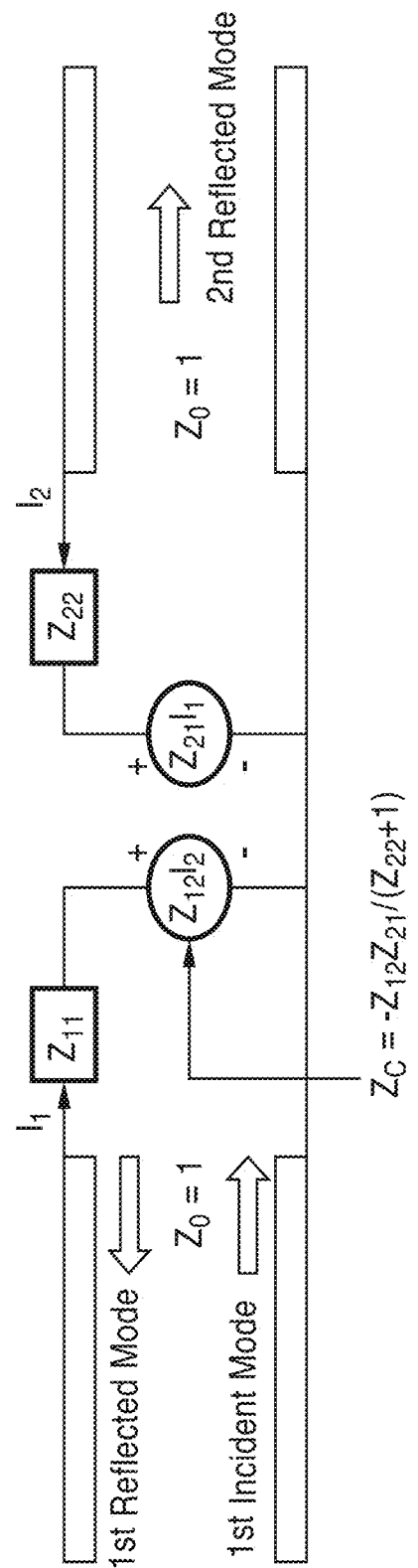
FIG. 9 is a schematic of a two-port circuit analogy which can be applied to reflectivity phenomena according to the invention.

FIG. 9 illustrates a two port circuit analogy for the HCG which is represented by perhaps the best known model for a two-port circuit. When the real part of $Z_C$ cancels-out the real part of $Z_{11}$, then 100% reflection is obtained as per Eq. 16.

The incident and reflected modes occurring at the left side transmission line shown in the figure, are an analogy to the plane wave, being incident and reflected from the HCG. The transmission line shown on the right side is an analogy to the second mode reflected from the HCG, which is a surface bound mode. In this analogy, the portion of the plane wave transmitted through the HCG is considered lost, and this loss is represented by a voltage drop associated with the real part of the impedance $Z_{11}$, while $Z_{22}$ plays the same role with regards to the second reflected mode. The HCG itself in this analogy is regarded as a coupling device between the first mode (plane wave) and the second mode, and is therefore represented by the two conditional voltage sources: $Z_{12}I_2$ represents the coupling from the second mode to the first and $Z_{21}I_1$ represents the coupling from the first mode to the second. Impedance $Z_C$ represents the coupling impedance from the second port into the first. Accordingly, the condition for full reflectivity of a two-port circuit is given by:

$$Re(Z_{11}) = -Re(Z_C) = Re[Z_{12}Z_{21}/(Z_{22}+1)] \quad (16)$$

When Eq. 16 is satisfied, the voltage drop associated with the real part of $Z_{11}$ is cancelled out by a voltage gain from the conditional source $Z_{12}I_2$, representing the feedback from the second port. In impedance terms, this entails the real part of $Z_{11}$ being cancelled out by the real part of $Z_C$. This means that the wave entering the first port encounters a non-resistive (purely reactive) impedance and is thus fully reflected. In the equivalent case of the HCG, when Eq. 16 is satisfied, the power carried by the plane wave does not leak through the grating. Instead, this power is being stored in the excited surface waves, which cannot carry the power out of the HCG and thus act as equivalent reactive elements. These surface waves couple the power back into the reflected plane wave, causing full reflection. This of course can never happen in a case of a uniform dielectric layer (grating with DC=100%), since it does not support surface waves upon plane wave incidence, and therefore the power cannot be stored and coupled back.

FIG. 10A through FIG. 10C depict reflectivity and impedance characteristics according to the inventive impedance analogy. In FIG. 10A a reflectivity spectrum is shown with the corresponding normalized input impedance, $Z_{in} = Z_{11} + Z_C$, encountered by the incident plane wave. The two high reflectivity peaks correspond to the two purely imaginary input impedances. The parameters are: TE polarization, $\eta_r$=3.2, DC=0.4, $t_g/\Lambda$=0.222.

The effective entrance impedance of the HCG, encountered by the incident plane wave is shown in the figure, along with the corresponding reflectivity spectrum. The set of figures illustrate that both reflectivity peaks correspond to entrance impedances which have no real part ($Re(Z_{in})$=0), which confirms that in the case of full reflection the HCG acts as an optical reactive element.

From the theory of Chebyshev filters it is known that when multiple spectral peaks are located in close vicinity of each other, a broadband spectrum is obtained. In addition, the spectral bandwidth of Chebyshev filters can be broadened at the expense of ripple. A similar phenomenon arises in the use of broadband HCGs, in which the number of proximal reflectivity peaks is typically two (or in rare configurations three). Designing a broadband HCG mirror relies on the fact that the HCG dimensions a, s, $\Lambda$, $t_g$, as seen in FIG. 1 and the wavelength $\lambda$, are all scalable, indicating that an HCG with dimensions (a, s, $\Lambda$, $t_g$) at wavelength $\lambda$, has the same reflectivity as an HCG with the dimensions (ca, cs, c$\Lambda$, c$t_g$) at wavelength c$\lambda$, with c being a positive constant. Using this filter analogy can greatly simplify HCG design, since the first steps can be performed in normalized units: $t_g/\Lambda$, $\lambda/\Lambda$ and DC=s/$\Lambda$, and then all the normalized dimensions can be scaled back according to the desired wavelength.

Figure 11A:
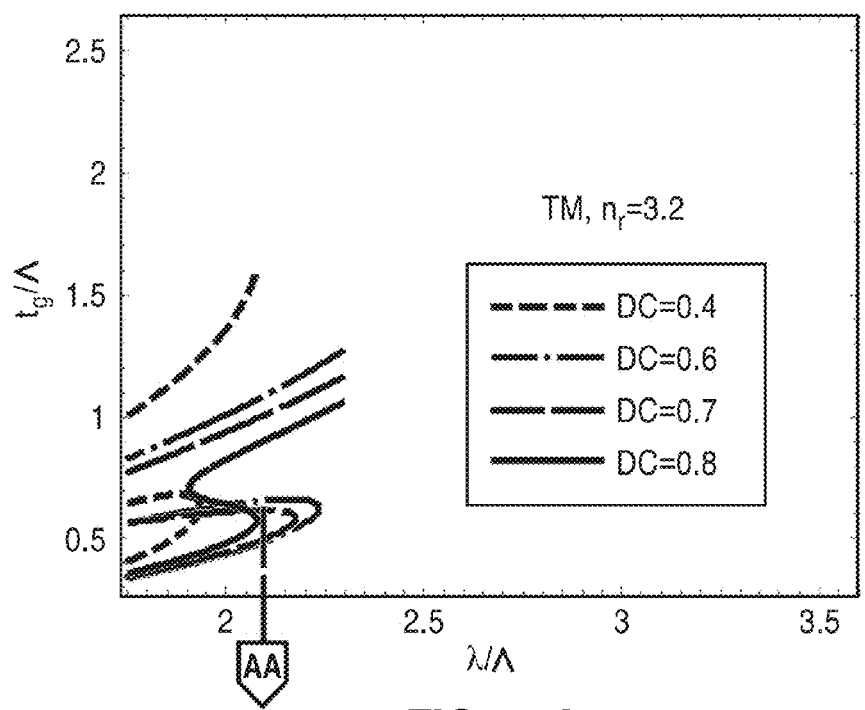
FIG. 11A through FIG. 11D are graphs of grating design parameters according to elements of the present invention.
Figure 11B:
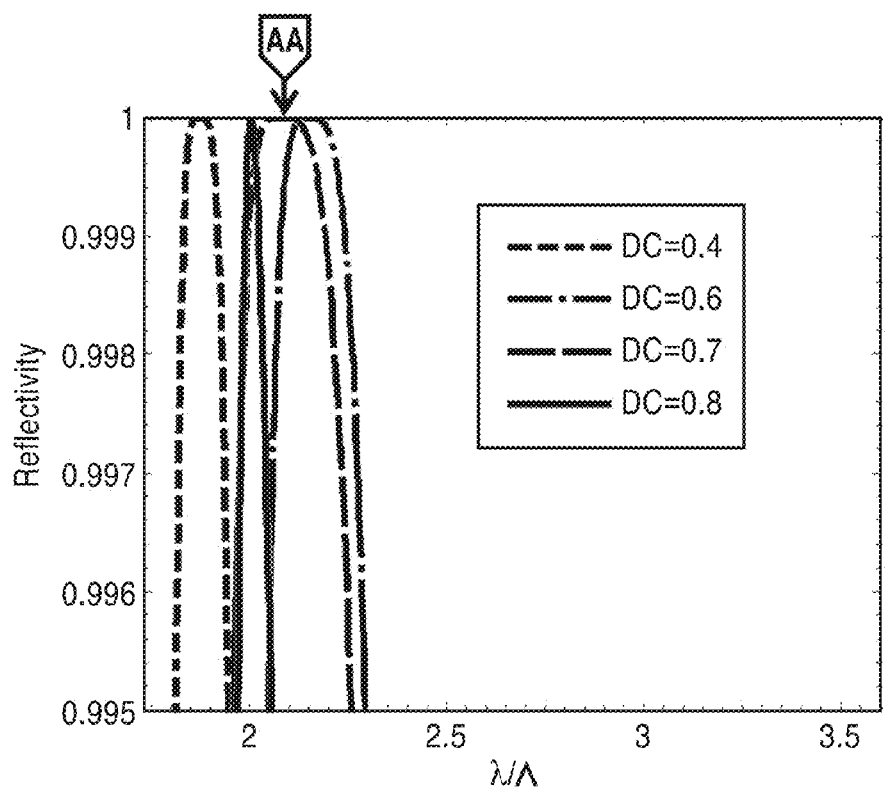
Figure 11C:
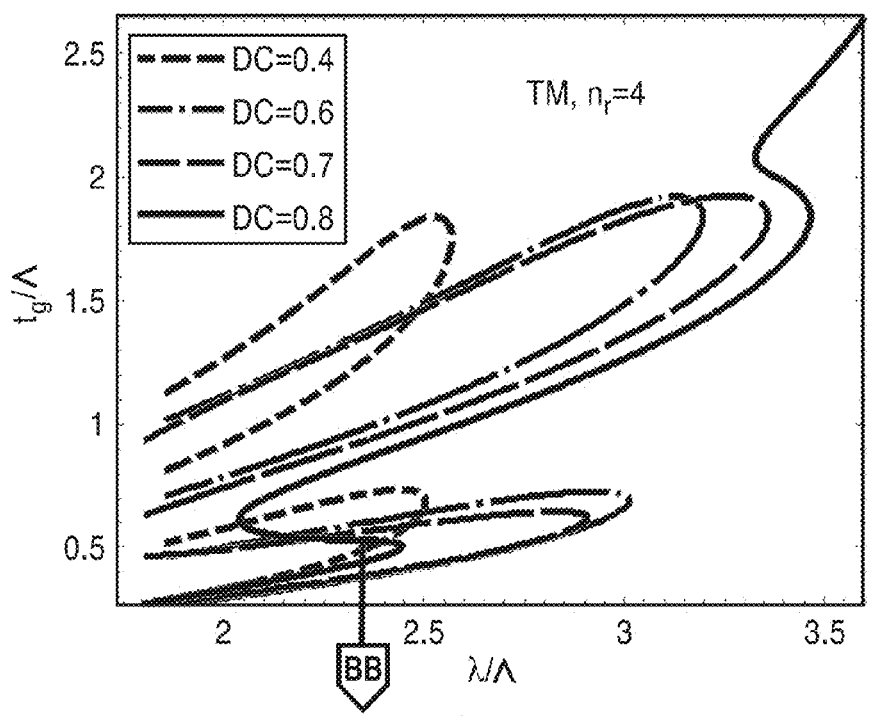
Figure 11D:
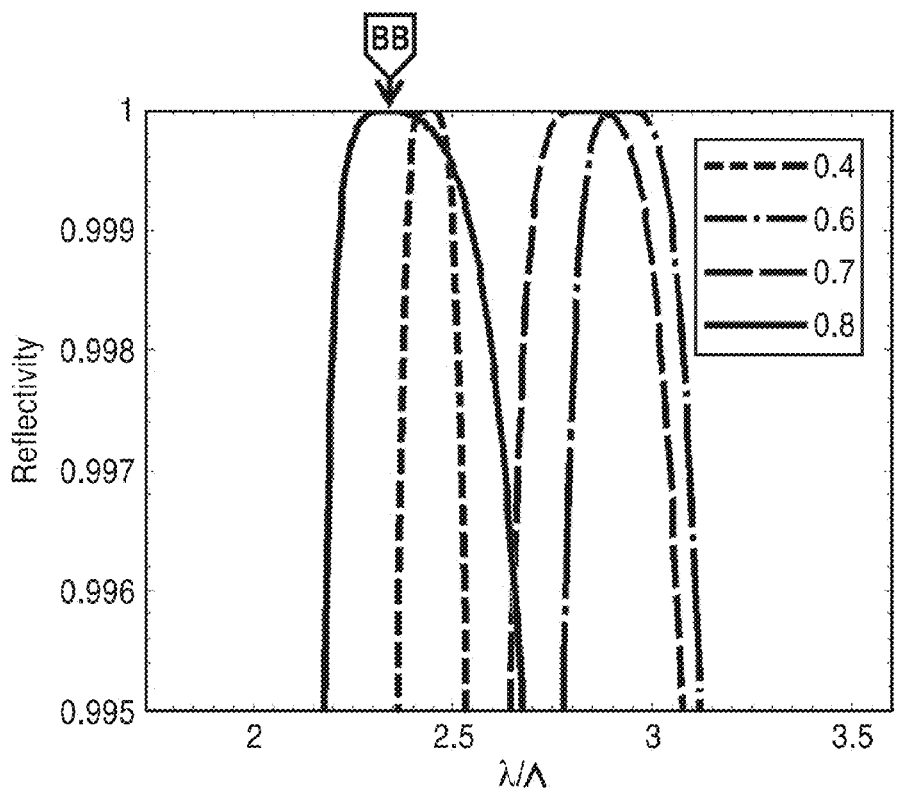

FIG. 11A and FIG. 11C illustrate plotting these optimal values of $t_g/\Lambda$ with respect to $\lambda/\Lambda$ for different duty cycles for two different refractive indices. The implementation of the filter analogy is as follows: (i) For each normalized wavelength $\lambda/\Lambda$, a discrete set of normalized thicknesses $t_g/\Lambda$ will generate 100% reflectivity by satisfying Eq. 16; (ii) Among all duty cycles in these curves the flattest region (broadest spectrum), corresponding to broad-band high reflectivity, is chosen as marked by the arrows shown from FIG. 11A and FIG. 11C, down to the reflectivity graphs of FIG. 11B and FIG. 11D. Higher refractive index contrast (right figures) leads to broader spectra. The middle of the flattest region corresponds to the optimal values of DC, $t_g/\Lambda$ and $\lambda/\Lambda$; (iii) Finally, according to the desired central wavelength $\lambda$, the normalized dimensions are rescaled.

Accordingly, FIG. 11A through FIG. 11D demonstrate implementation for two different refractive indices $\eta_r$=3.2 (FIG. 11A and FIG. 11B) and $\eta_r$=4 (FIG. 11C and FIG. 11D) and it reveals the intuitive conclusion, which is at the core of the motivation for using High Contrast Gratings, that when the refractive index contrast is higher ($\eta_r$=4), the achievable spectra are broader. In addition, when the refractive index contrast is higher, the range of grating geometries supporting high reflectivity becomes wider, as reflected in the differences seen between FIG. 11A compared with FIG. 11C. This is why high contrast gratings tend to provide large fabrication tolerances.

Figure 12:
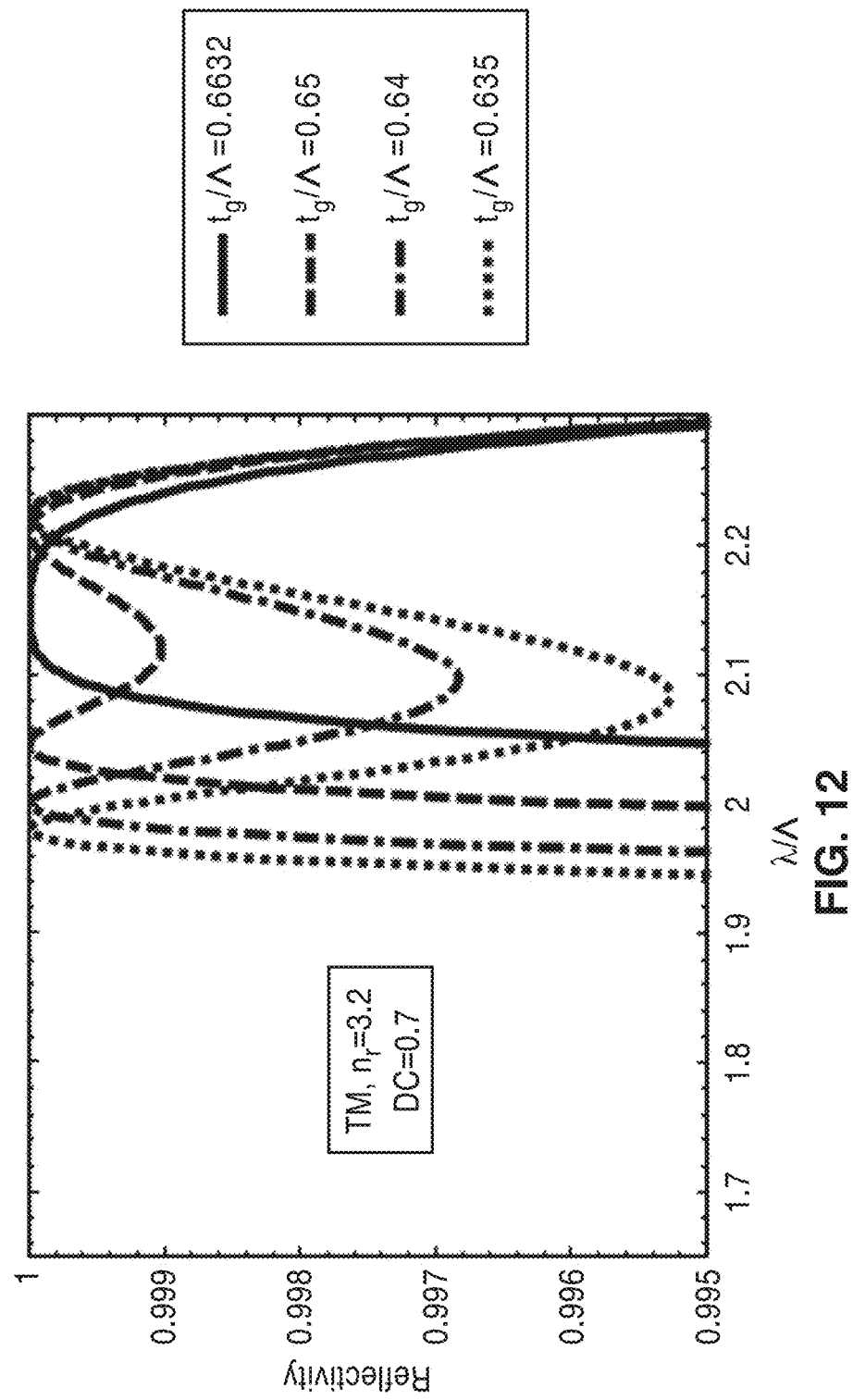
FIG. 12 is a graph of grating line width with respect to ripple found in the similar Chebyshev filter according to elements of the present invention.

FIG. 12 depicts tradeoffs of line width and ripple in a similar manner as used with Chebyshev filters; that is, once the broadband configuration is found, the reflectivity spectrum can be broadened even further by decreasing the grating thickness. In demonstrating the similarity to Chebyshev filters, It will be noted that a decrease in grating thickness will push the two overlapping peaks apart, further increasing the bandwidth at the expense of rippling the spectrum.

1.2 Destructive Interference at the Output Plane.

In addition to the transmission line formulation described above, the following offers an intuitive description for the phenomenon of 100% reflectivity in terms of wave interference.

First consider a reflection from a uniform dielectric layer. In order for the reflection to reach 100%, the transmission must be fully cancelled. In the case of surface normal incidence, zero transmission can only be obtained if the lateral (x,y) electric and magnetic field components inside the layer are zero at the back output plane (z=0). In the case of uniform dielectric layers, however, it is obvious that the electric and the magnetic fields cannot both have minima at the same z, since minima of one is always accompanied by maxima of the other. However, if it were possible to excite more than one mode within the uniform layer, the additional degree of freedom would have made it possible to design a geometry in which the multiple modes interfere with their reflected counterparts in a way that the overall E and H field components are both zero at z=0.

Unfortunately, in simple uniform dielectric layers multi-mode excitation does not occur under the condition of plane wave incidence. The alternative is to break the uniformity by introducing a grating. When a plane wave is incident upon a grating, multiple modes are excited within it, which introduces the necessary degree of freedom to achieve destructive interference at the back output plane. Since the grating modes are not laterally constant, instead of the overall field being zero, their average (with respect to x axis) is required to be zero, since it is the lateral average that determines whether or not there is a field overlap with the transmitted wave, and thus whether or not the transmitted wave can be excited.

Figure 13:
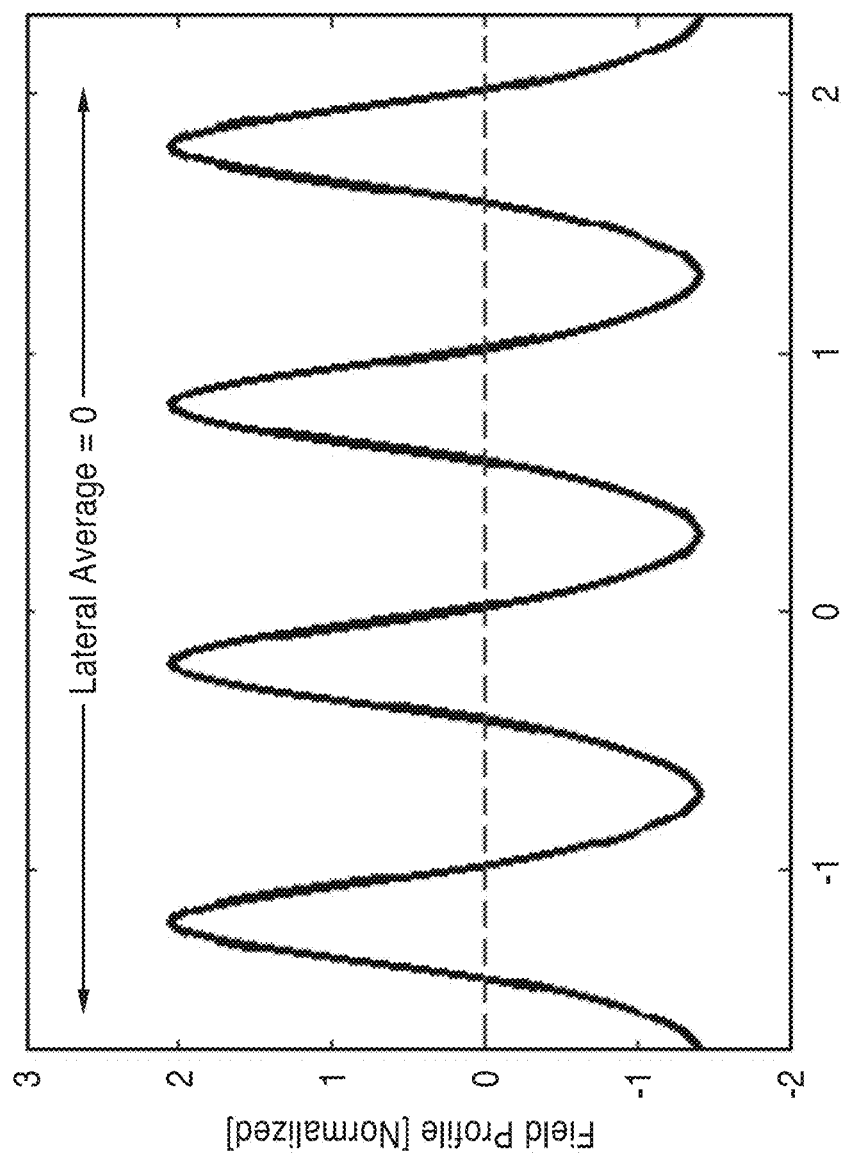
FIG. 13 is a graph of grating field profile with respect to period ($\lambda/\Lambda$).

FIG. 13 depicts a field profile at the bottom grating output plane (back output plane) of the HCG (z=0). The zero lateral average is an indicator for the perfect destructive interference, whereby the overall field profile, which combines all modes and their reflections, is zero on average.

2. HCG Reflection Enhancement

High Contrast Gratings (HCGs) provide compact structures having a high level of reflection which can be beneficially utilized in a number of applications. These qualities can be improved according to the present invention by the addition of a buried or distant metallic (e.g., Au, Ag, or other metals and combinations thereof) thin-film mirror, spaced at a distance, which enhances the surface-normal and glancing-angle reflective properties of the HCG. The simulations below were performed using rigorous coupled-wave analysis (RCWA).

Figure 14:
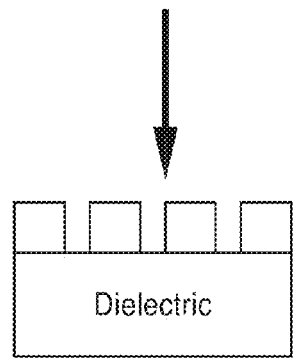
FIG. 14 is a schematic of a typical high-contrast grating, showing optical energy incident upon a high index of refraction grating disposed over a low index of refraction dielectric.

FIG. 14 depicts a typical high-contrast grating (HCG) on dielectric upon which surface-normal light is shown incident. In this example, the HCG elements have an index of refraction which differs from the surrounding material by at least approximately one, and preferably two or more units. In the given example, the grating bars have a high index of refraction surrounded by low index material. In the following section, however, an example of a low index "inverse-tone" grating is described in which, with the proper selection of grating parameters and materials, the low index spaces (or material) comprise the grating which is surrounded by high index material.

In the embodiment described, the parallel bars of the grating elements represent a dielectric material with a refractive index ($\eta_r$), which significantly differs from the refractive index of the surrounding medium. In this example, the typical refractive index of the high-index grating bars is approximately 3 to 3.5, and the outside medium is assumed to be a low refractive material or air ($\eta_r=1$). It should be appreciated that the material surrounding the grating bars need not be of the same composition, for example the materials above, below and between the grating elements (grating bars) need not be of the same material, any may even be somewhat different in regard to their respective index of refraction.

It should be appreciated that increasing the depth of the dielectric, beyond that shown in FIG. 14, does not lead to a reflectivity increase, insofar as existing depth prevents evanescent coupling from the grating.

Figure 15:
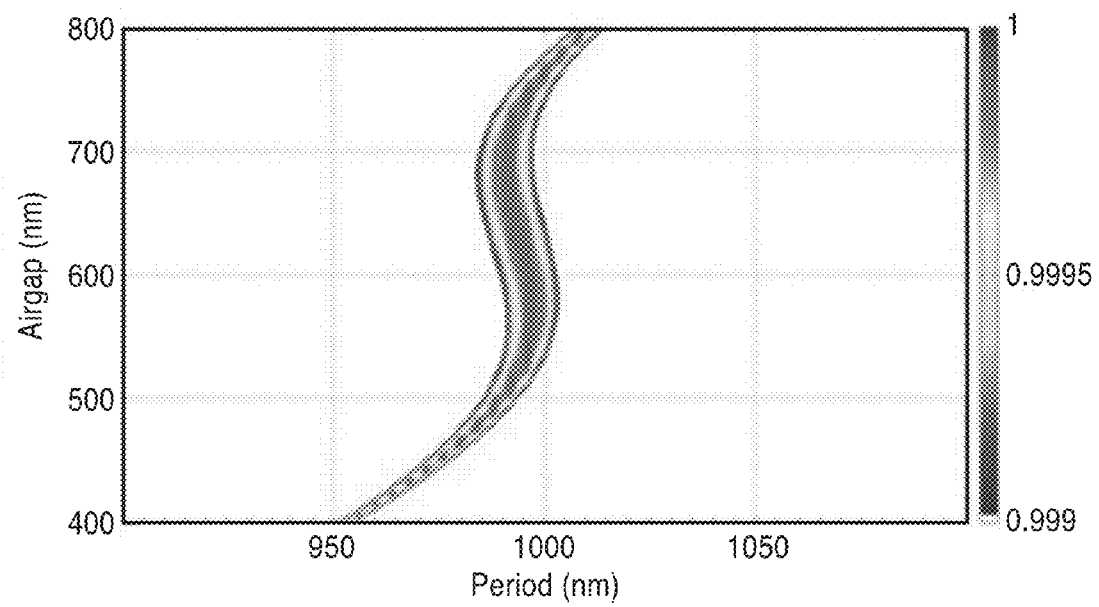
FIG. 15 is a graph of reflectivity as a function of wavelength and airgap for an HCG having a deep dielectric layer.

FIG. 15 depicts reflectivity for an HCG similar to that of FIG. 14, but having an extended dielectric comprising a thick glass layer. The TE reflectivity is shown at 1550 nm as a function of grating airgap and period for a grating of 195 nm thick Indium Phosphide (InP) over 1073 nm thick layer of glass. The darker shaded areas of the graph toward the center are the more highly reflective.

Figure 16:
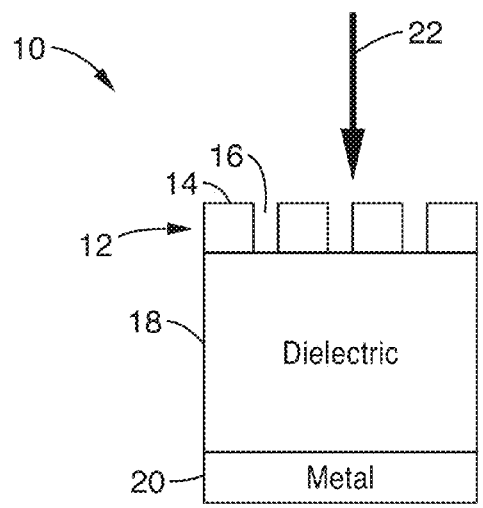
FIG. 16 is a schematic of an enhanced reflection HCG grating, showing a distant buried metallic thin-film mirror according to an element of the present invention.

FIG. 16 illustrates an example embodiment 10 of an enhanced-reflectivity HCG 12 having high index grating bars 14 separated by spaces 16 upon which optical energy is incident 22. A high reflectivity of the grating itself is achieved in response to cancellation of the zeroeth-transmissive order, and total reflectance is then enhanced in accordance with the teachings of the invention. An adjoining material layer is exemplified as a thick dielectric layer 18 shown adjacent grating 12, and configured with a metal film 20. The inclusion of both the thick dielectric layer and the metallic layer are required for boosting the reflective bandwidth of the HCG. The metal film being distant from the grating comprises a buried/distant metal film layer. By way of example and not limitation, the metal layer preferably comprises silver (Ag) or gold (Au); although other metallic material may be utilized, or less preferably other reflective materials, without departing from the invention. By way of example, the gold layer is depicted as 100 nm thick, although it only need be as thick as optical skin depth for the given material, which is at least 2 nm and more preferably approximately 20 nm.

The necessary depth of the thick dielectric layer 18 is given by the following relation:

$$\text{Dielectric Depth} > \left[\frac{\lambda}{2\pi}\right] \bigg/ \left[\left(\frac{\lambda}{\Lambda}\right)^2 - n_r^2\right]^{1/2}$$

where $\lambda$ is the wavelength, $n_r$ is the refractive index of the dielectric, and $\Lambda$ is the grating period. Accordingly, the depth of the dielectric material must be sufficient in relation to the geometry of the grating.

It should be noted that although a single adjoining material layer is described as the thick dielectric layer, any combination of materials which operate in combination as a single adjoining material layer with the given refractive index may be less preferably utilized without departing from the teachings of the present invention It should be appreciated that the additional metal film layer is separated from the grating layer by a depth of over 1000 nm which is over five times the grating thickness, wherein the metal layer is referred to as a buried-distant metal film layer.

Figure 17:
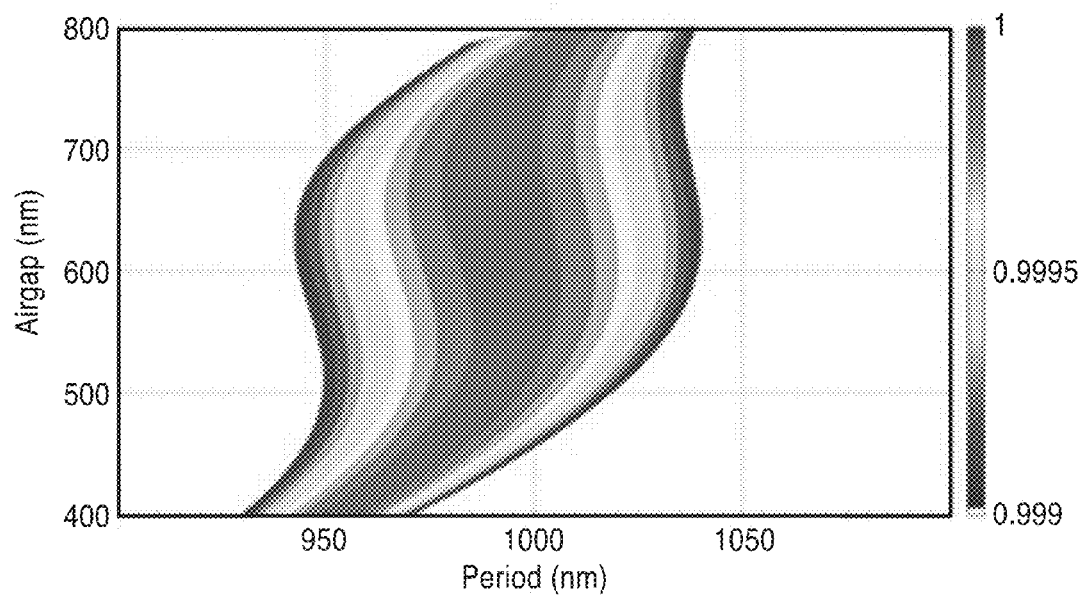
FIG. 17 is a graph of reflectivity as a function of wavelength and airgap for the enhanced reflection HCG grating of FIG. 16.

FIG. 17 depicts reflectivity for the HCG shown in FIG. 16. The dielectric layer 18 is shown by way of example and not limitation as comprising 1073 nm of glass, with the metallic layer comprising 100 nm of gold (Au). It is readily discernable from the graph that the reflectivity contours are enhanced. It can be seen from comparing FIG. 17 with FIG. 15, that this enhancement increases the reflectance above 0.999, from a bandwidth of less than 20 nm to a bandwidth approaching 100 nm, which provides a five-fold increase in bandwidth.

It should be appreciated that although the grating elements are shown as straight line parallel segments, they may be alternatively configured as curving segments or concentric circle segments, without departing from the teachings herein. Similarly, the grating sizing and spacing (period) can vary (e.g., chirped) along the length of the segments and/or transverse to the segments.

These teachings can be combined to support a wide range of applications. For example, the combination of buried metallic layer at the correct depth from an HCG configured for saturable absorption, as described in another application by the Applicant, which can provide a saturable absorber mirror. Additionally, the distant metal layer can be utilized in an HCG-based hollow core waveguide to enhance reflectivity. Still further, any reflective application of an HCG can be enhanced by a distant metallic film, including but not limited to HCG saturable absorbers, VCSELs, resonators, filters, and so forth.

3. Inverse Tone HCG

A regular subwavelength HCG relies on high index contrast between the grating bars and the surrounding air for dispersing the incident light into two grating modes, which interfere destructively with their reflections at the back grating interface, thus cancelling the transmission and results in nearly 100% of the power being reflected. Yet, problems exist regarding electrical and thermal conductivity considerations when attempting to integrate typical HCG solutions as VCSEL bottom mirrors, because these lower layers of the VCSEL are typically embedded in relatively high refractive index semiconducting materials. Accordingly, a novel "inverse-tone" HCG is described which provides very high reflectivity and can be readily integrated with adjacent high index layers.

The IT-HCG, requires a different structure which does not rely on an internal high contrast between the grating bars and the surrounding material. To compensate for the reduced index contrast with the surrounding medium, the IT-HCG is designed to rely on the initial reflection enhancement upon wave incidence, caused by the double index discontinuity at the transition from outside medium (top layer) into the grating—high index to low index for air-gaps (hence the name "Inverse-tone" grating) and low index to high index for grating bars. The initial reflection enhancement, combined with the destructive interference of the grating modes, combine together to achieve a reflectivity which can be significantly above 99%. By configuring the grating parameters and selecting the proper material, the present invention allows the creation of an inverse-tone grating.

Figure 18:
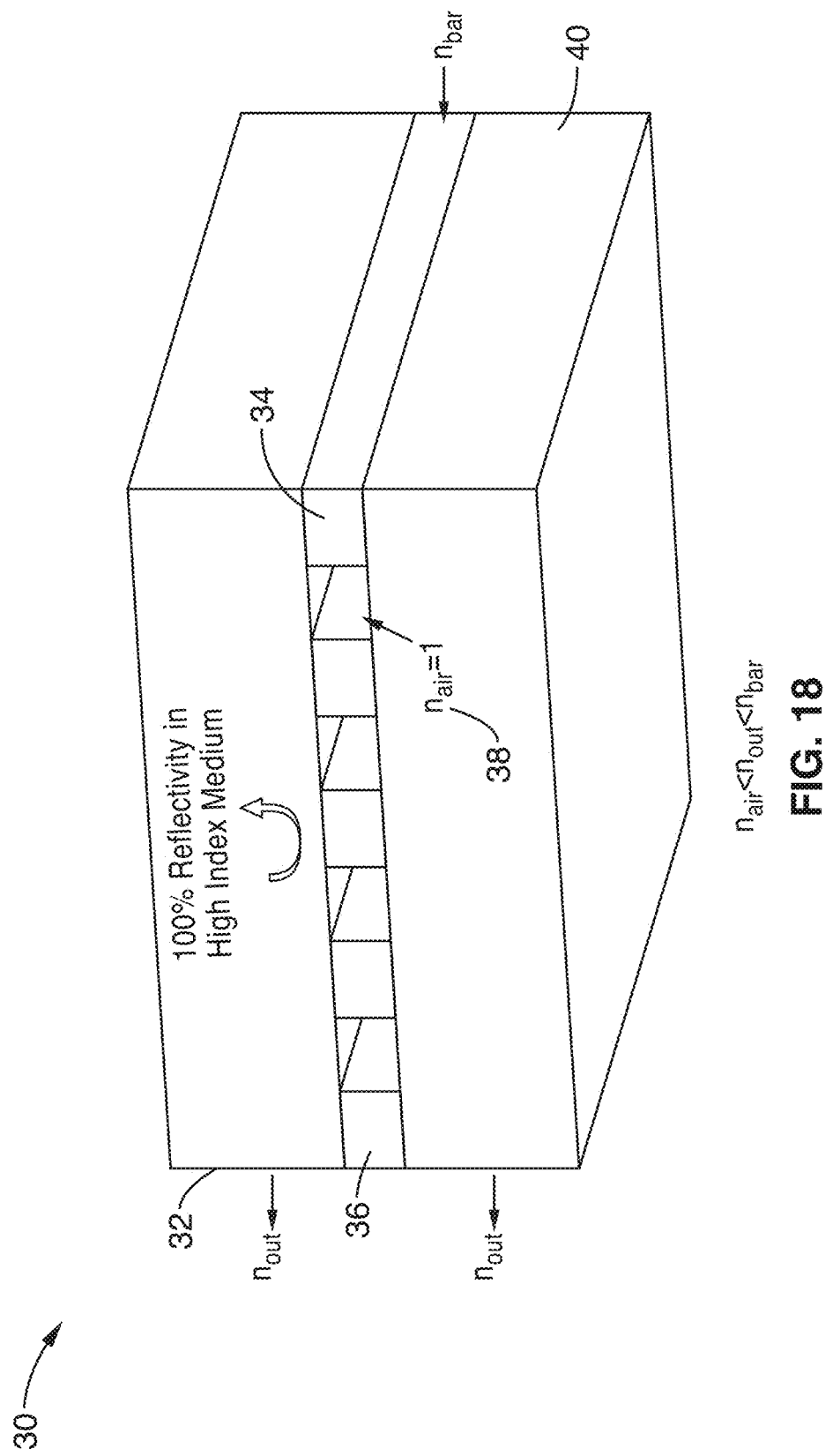
FIG. 18 is a schematic of an inverse-tone HCG (IV-HCG) grating according to an element of the present invention, showing the grating layer integrated into materials of moderate to high index of refraction.

FIG. 18 illustrates an example embodiment 50 of an inverse-tone High Contrast Grating (IT-HCG) with a grating layer 34 shown between an upper layer 32 and lower layer 40. Grating layer 34 comprises alternating grating bars 36 and spaces 38. It should be appreciated that the material surrounding the grating bars need not be of the same composition, for example the materials above, below and between the grating elements (grating bars) can be of different materials, or even have slightly somewhat different indexes of refraction.

The index of refraction of the materials are designated as grating bars $n_{bar}$, spaces between bars $n_{air}$, and adjacent materials as $n_{out}$. Operating in the inverse-tone mode requires that $n_{air} < n_{out} < n_{bar}$. The IT-HCG subwavelength grating is capable of providing a reflectivity approaching 100%, even when embedded in moderate to high index medium. The interior of the IT-HCG still maintains high index contrast between semiconductor bars and air-gaps, while the medium above and beneath the HCG preferably has a moderate to high refractive index, which is most preferably selected to be between that of air and that of the grating bars.

It will be appreciated that the inverse tone grating can be utilized in a number of additional applications, including various reflective and lensing applications. The following section describes an enhanced reflectivity vertical cavity surface emitting laser (VCSEL).

4. VCSEL Using Enhanced Reflectivity Inverse-Tone HCG

Figure 19:
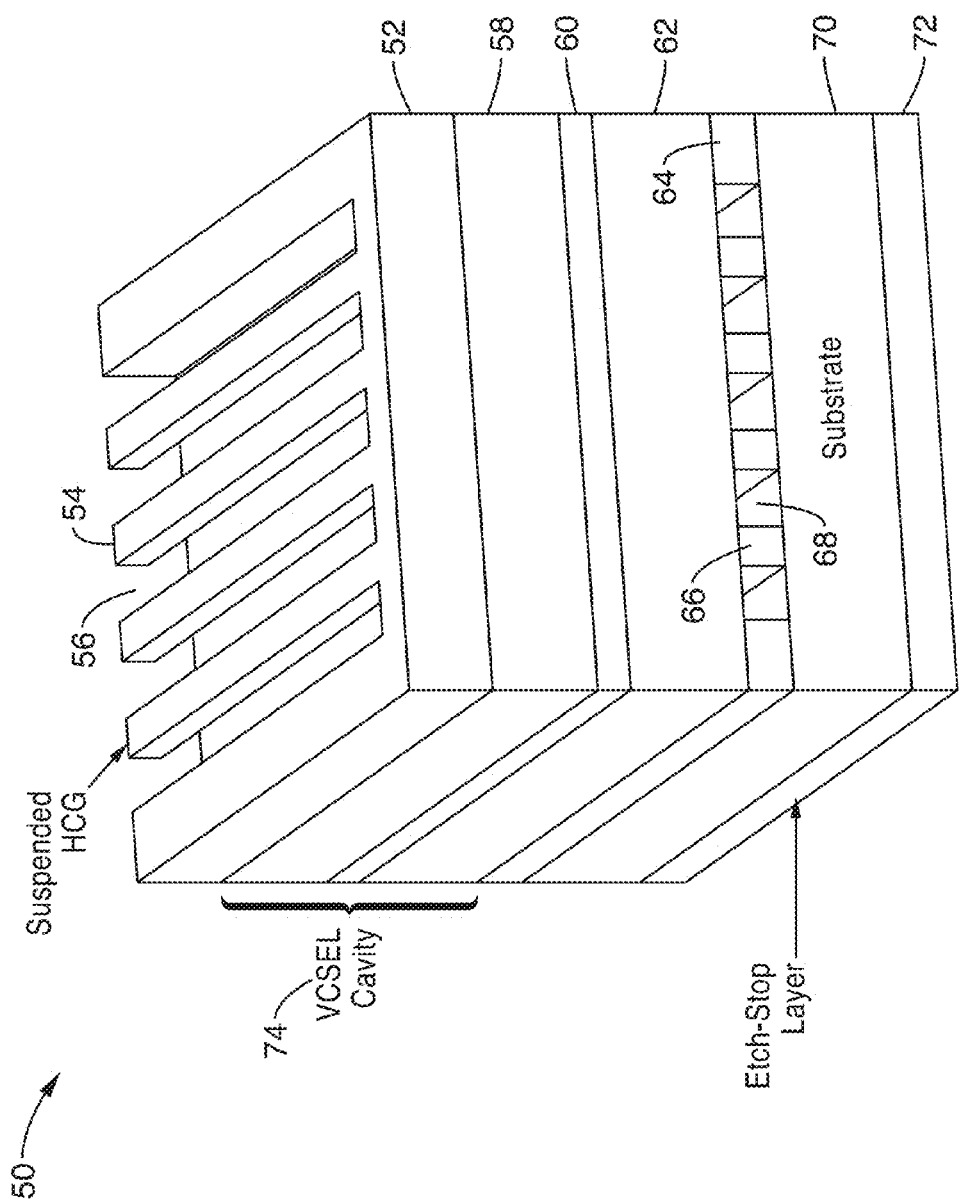
FIG. 19 is a schematic of an inverse-tone HCG (IV-HCG) grating integrated within a VCSEL according to an element of the present invention.

FIG. 19 illustrates embedding of an HCG within an example VCSEL embodiment 50 as a replacement for the bottom DBR mirror, with the top DBR mirror shown replaced by a freely suspended HCG. A top HCG layer 52 is shown having alternating grating bars 54 and spaces 56, with the grating bars are suspended from a portion the grating layer without spaces (e.g., not etched away). The VCSEL cavity is shown with layers 58 and 62 surrounding an active region 60 (e.g., a quantum structure layer). At the base of the cavity is shown bottom mirror 64 comprising an HCG having alternating bars 66 and spaces 68.

It will be appreciated that the HCG can be beneficially embodied with the bottom HCG comprising an IT-HCG, thus allowing material layers 58, 62 and 70 to comprise materials having a moderate to high index of refraction, such as semiconductor material. Beneath the bottom mirror 64 is shown a substrate 70 and etch-stop layer 72. The material of cavity layer 62 and substrate 70 have an index of refraction of $n_{out}$ while the grating and spaces have an index of $n_{bar}$ and $n_{air}$, respectively, as described in regard to FIG. 18.

The resulting device has a very small number of layers as it has no need of epitaxy for many tens of successive layers for DBRs, and thus provides an exceedingly simple fabrication process. In addition, the compact size of the VCSEL utilizing an IT-HCG bottom mirror provides significantly improved VCSEL thermal conductivity and lowered electrical resistance.

Figure 20:
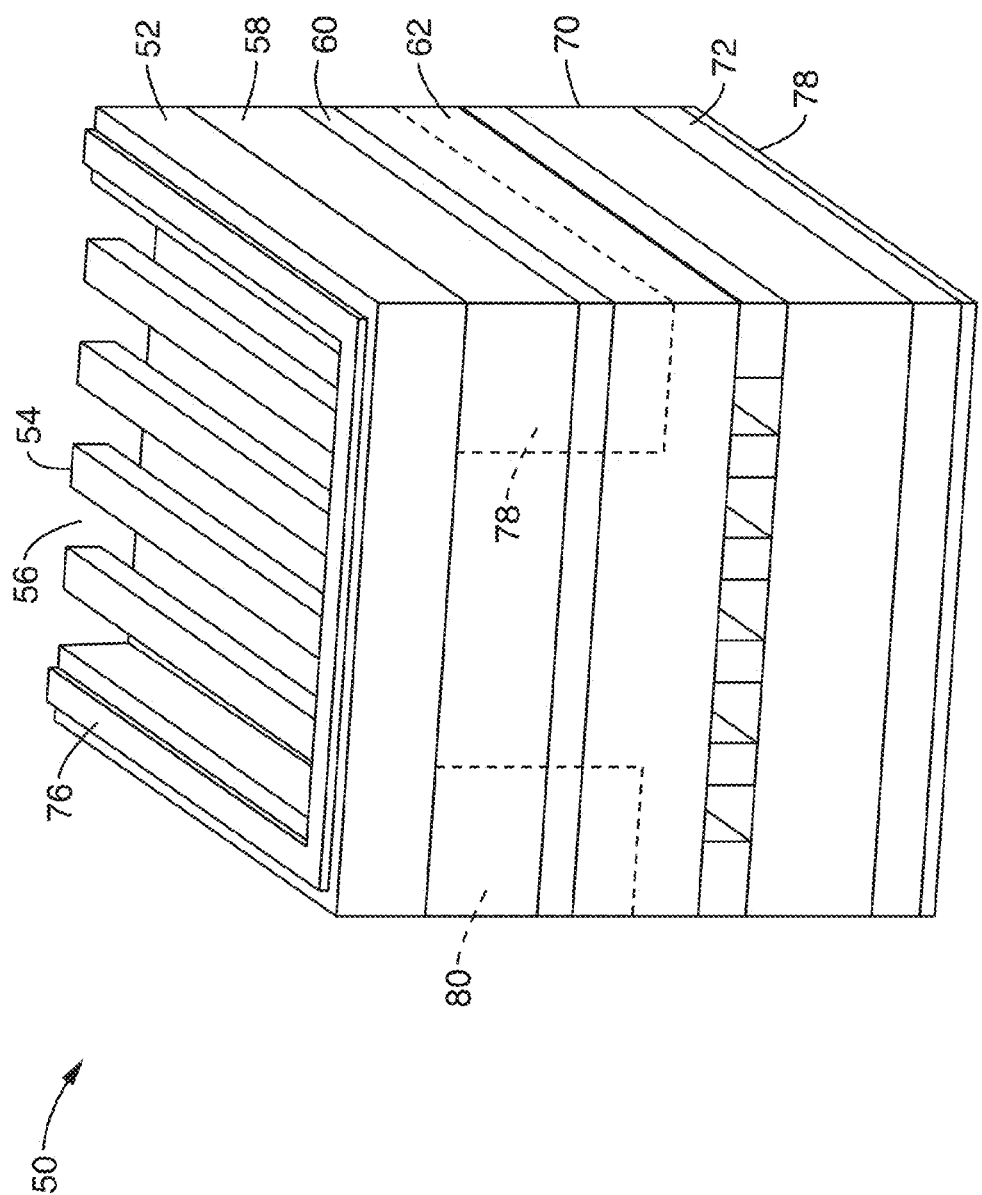
FIG. 20 is a schematic of an inverse-tone HCG (IV-HCG) grating integrated within a VCSEL according to an element of the present invention, showing current containment along with top and bottom electrical contacts.

FIG. 20 illustrates an embodiment 50 of the VCSEL with integrated IT-HCG, showing current guidance details of this double-HCG VCSEL. By way of example and not limitation the IT-HCG bottom mirror is shown integrated into a 980 nm InGaAs VCSEL, with grating dimensions of 362 nm period, 250 nm thickness, and 290 nm bar width. The refractive indices are of the respective materials are $n_{out}$=1.7 and $n_{bar}$=3.6. For comparison use of a high index material $n_{out}$=2.8 results in a lower bandwidth (8 nm), as described in a later figure.

A top HCG layer 52 with alternating grating bars 54 and spaces 56, cavity layers 58 and 62 surrounding active region 60, with bottom mirror 64 comprising an IT-HCG having alternating bars 66 and spaces 68, substrate layer 70 and etch-stop layer 72. A top contact 76 is shown and a bottom contact 78. Current confinement regions 80 are depicted by the dashed lines which confines the sides of the cavity. Current confinement regions can be achieved by any desired means, such as using proton implant, buried heterostructure, oxidation, or other techniques and combinations thereof.

This embodiment is also shown with the bottom contact separated by a deep layer 70, so that the bottom metallic contact can also operate as the buried/distant metallic layer which enhances reflectivity, as described in the first portion of the application. It should be appreciated that a VCSEL structure could be implemented with the IT-HCG bottom mirror, but lacking the buried/deep metallization layer, without departing from the teachings of the present invention.

Figure 21:
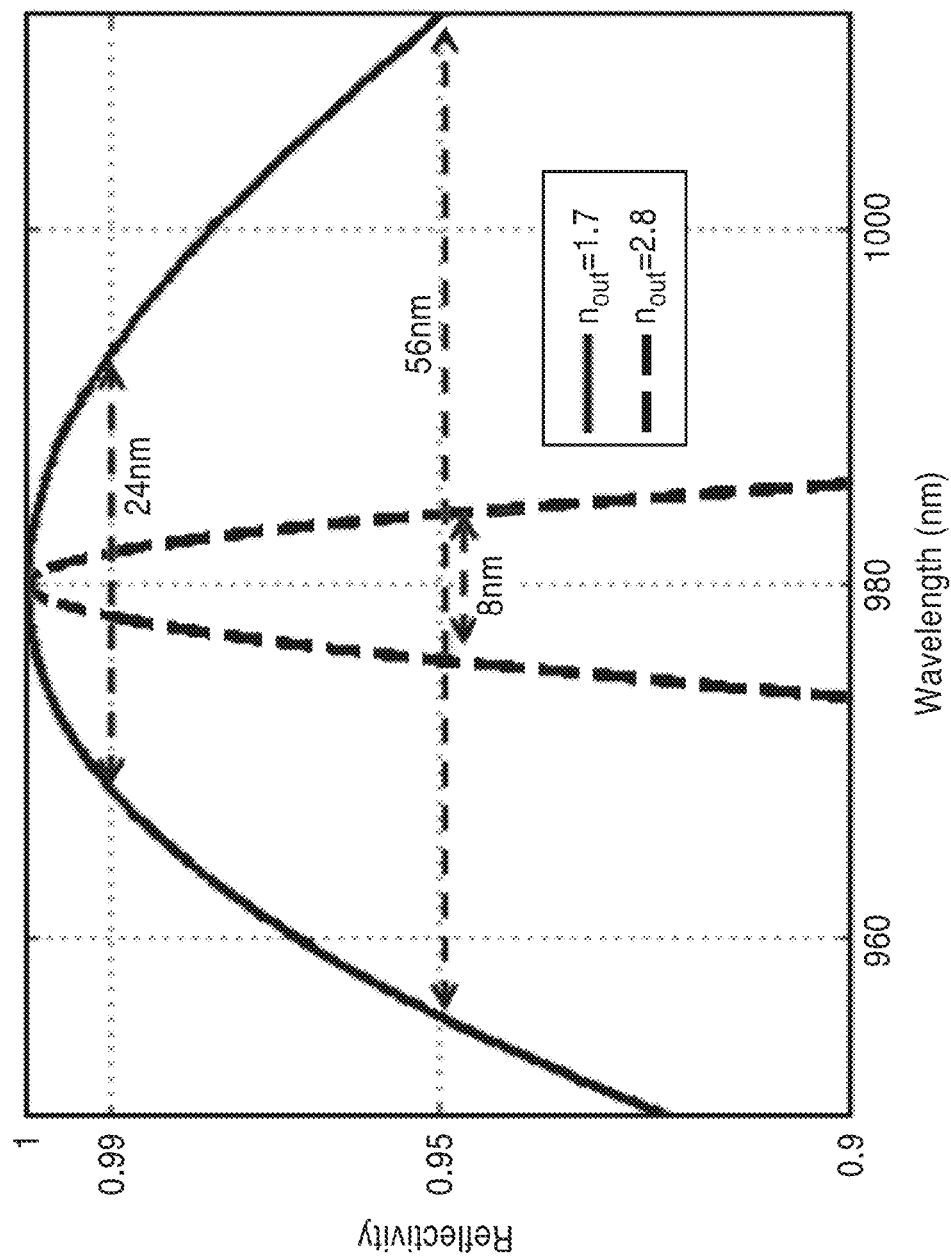
FIG. 21 is a graph of reflectivity as a function of wavelength in response to two different $n_{out}$ material indices according to an element of the present invention.

FIG. 21 depicts reflectivity with respect to wavelength and $n_{out}$ values for the embodiment shown in FIG. 20. As can be seen, the embodiment provides a 24 nm 99% reflectivity bandwidth, with 56 nm 95% reflectivity bandwidth, around a laser wavelength of 980 nm, assuming Aluminum Gallium Arsenide (AlGaAs) based layer structure with an Indium Gallium Arsenide (InGaAs) active region. Use of even a high index material with material $n_{out}$=2.8, still results in a usable bandwidth of 8 nm.

Figure 22B:
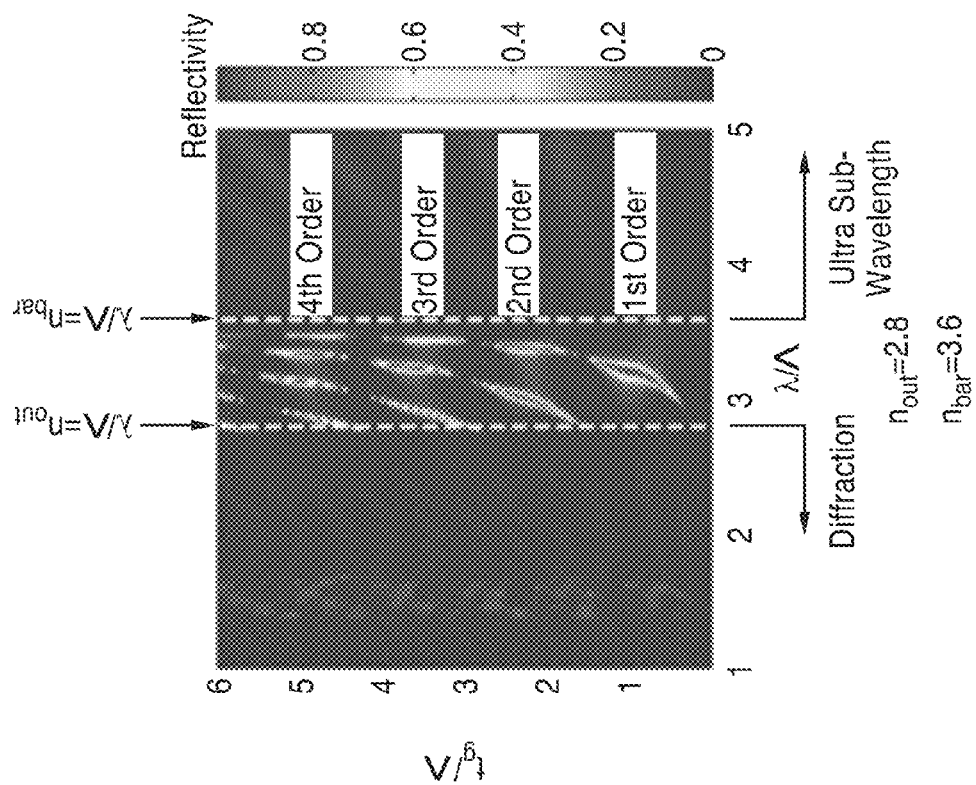
FIG. 22A and FIG. 22B are contour plots of reflectivity for IT-HCG for two different $n_{out}$ materials according to an element of the present invention.
Figure 22A:
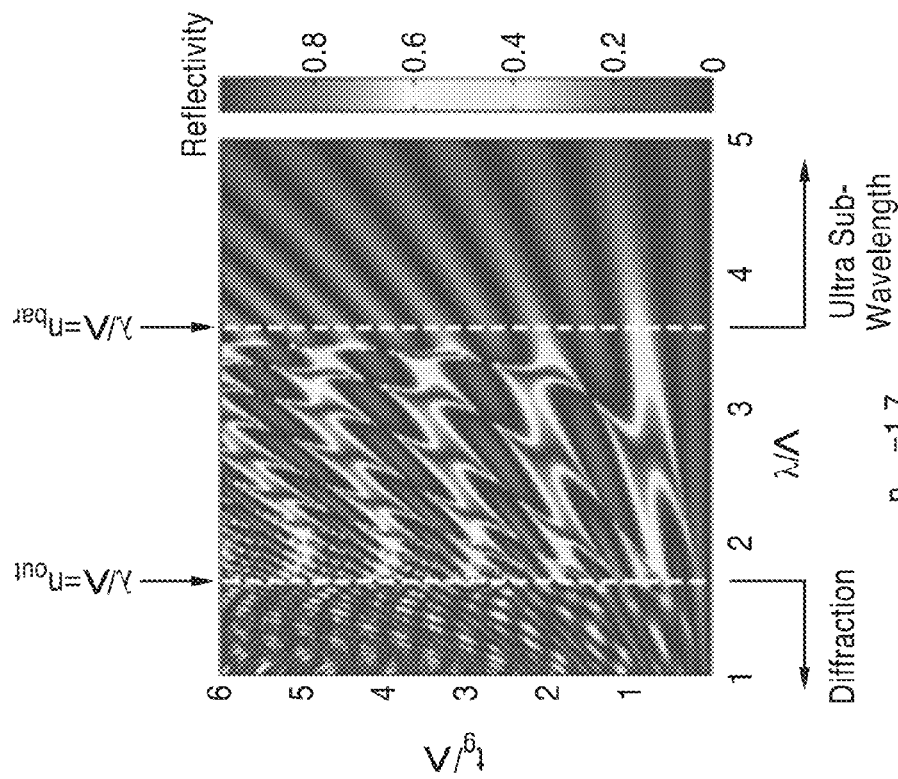

FIG. 22A and FIG. 22B depict reflectivity contours of IT-HCG surrounded by a medium shown exemplified at two different refractive indices 1.7 for AlAs oxide in FIG. 22A and 2.8 for AlAs in FIG. 22B. The spectral operating window of the IT-HCG is clearly marked in the figure by white dashed lines showing $$n_{out} < \frac{\lambda}{\Lambda} < n_{bar},$$

where $\lambda/\Lambda$ is the ratio between the grating wavelength and period. Only within this operating window is the high-reflectivity provided. As the grating thickness ($t_g$) increases the order of the high reflectivity bands increases. It will be appreciated that the "order" comprises the number of reflectivity peaks within the operating window. Outside of this window the reflectivity can be seen to be much lower. If $\lambda/\Lambda$ is smaller than $n_{out}$, higher diffraction orders appear wherein achieving high reflectivity becomes difficult, since suppression of more than one transmissive order at the same wavelength is unlikely. If $\lambda/\Lambda$ is larger than $n_{bar}$, the grating enters the ultra-subwavelength operating regime, where the wavelength is too large to react to individual corrugations and the grating behaves as a uniform layer with an effective refractive index. This effective refractive index is different for TM and TE polarizations, which gives rise to the birefringence phenomenon. Typically, when $n_{out}$ is smaller, as in FIG. 22A, the spectral operating window of IT-HCG becomes larger. By contrast FIG. 22B shows that the spectral operating window comprises reflectivity bands of different orders, whereby the mth order has m reflectivity peaks.

Figure 23:
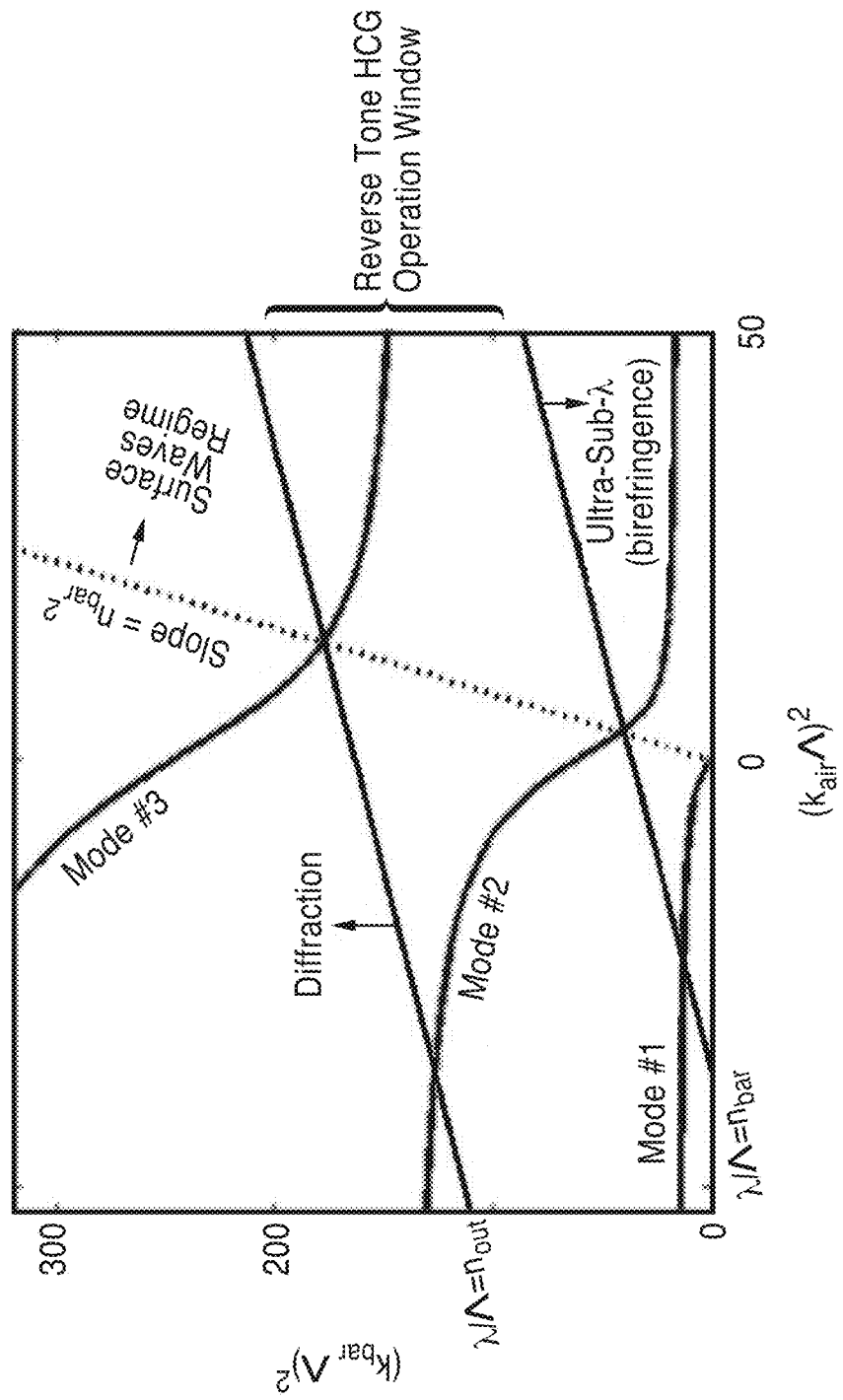
FIG. 23 is a graph of grating modes and a reverse tone operating window according to an element of the present invention.

FIG. 23 depicts reverse tone operating window for IT-HCG. The three curves marked mode #1, mode #2 and mode #3 represent the grating modes. The two parallel lines represent the operating window of IT-HCG, which can also be seen in FIG. 22A-22B. The near vertical dashed line represents the limit at which grating modes become surface bound. The operating spectral window of IT-HCG is bounded by diffraction regime from the left in which the wavelength is too small, and by the ultra-subwavelength birefringent regime from the right in which the wavelength is too large. Within the spectral operation window of IT-HCG only two grating modes are propagating which are not surface bound.

Figure 24:
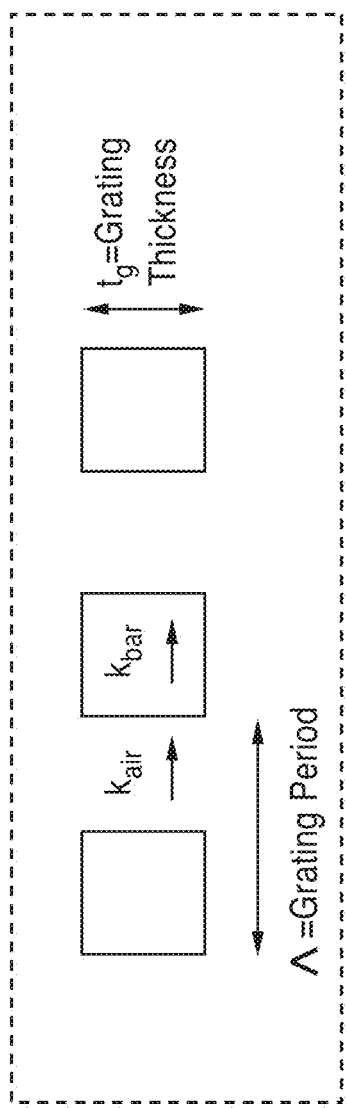
FIG. 24 is a schematic side view of grating dimension and period according to an element of the present invention.

FIG. 24 illustrates the values of bar thickness $t_g$, $k_{air}$, $k_{bar}$ and period $\Lambda$ for an example grating cross-section. The dispersion relation of IT-HCG as shown by the curves in FIG. 23 are the grating modes which are governed by the following dispersion equation:

$$k_{air} \tan [\Lambda k_{air}(1-DC)] = k_{bar} \tan [\Lambda k_{bar} DC]/n_{bar}^2. \quad (17)$$

It will be seen that $k_{air}$ and $k_{bar}$ in Eq. (17) are the lateral wave numbers inside the air-gaps and the grating bars respectively, while DC refers to duty cycle which is the grating bar width divided by the grating period. The two parallel lines in FIG. 23 indicate the spectral operating window of IT-HCG, with the top line is given by the equation: $k_{bar}^2 - k_{air}^2 = (2\pi/\lambda)^2(n_{out}^2 - 1)$, while the bottom line is given by $k_{bar}^2 - k_{air}^2 = (2\pi/\lambda)^2(n_{bar}^2 - 1)$. The near vertical dashed line indicates the limit at which the grating modes enter the surface wave regime, such as when they become evanescent in the longitudinal (up and down) direction. The fact that all three curves intersect at the same two points gives a unique insight on the meaning of the IT-HCG operating window, as being a window at which the grating has only two propagating modes, while the remainder of the modes are surface-bound.

From the above discussion it will be appreciated that IT-HCG apparatus and methods provide a single layer polarization-selective bottom mirror which can be utilized in a wide number of applications, such as for a lower focusing element in a VCSEL.

5. Conclusion

The present invention provides methods and apparatus for enhancing HCG reflectivity regardless of device medium. Inventive teachings can be applied in a variety of apparatus and applications as described.

As can be seen, therefore, the present invention includes the following inventive embodiments among others:

1. An apparatus for optical reflection, comprising: a high-contrast grating (HCG) having grating elements spaced apart from one another at a grating thickness, width and subwavelength period spacing to provide a desired level of reflectance; an adjacent material layer, as a deep layer, having a sufficient depth in relation to operating wavelength, refractive index of said adjacent material layer, and period of said high-contrast grating; and a metallic layer, adjacent said deep layer, having a sufficient thickness to provide desired reflection enhancement to said high contrast grating; said high-contrast grating elements have an index of refraction which differs from the material between the grating elements by at least one.

2. The apparatus of embodiment 1, wherein said sufficient depth of said adjacent material layer is given by the following relation:

$$\text{Sufficient Depth} > \left[\frac{\lambda}{2\pi}\right] \Big/ \left[\left(\frac{\lambda}{\Lambda}\right)^2 - n_r^2\right]^{1/2}$$

where $\lambda$ is the wavelength, $n_r$ is the refractive index of the dielectric, and $\Lambda$ is the grating period.

3. The apparatus of embodiment 1, wherein said metallic layer has a thickness which equals or exceeds optical skin depth for the material utilized in the metallic layer.

4. The apparatus of embodiment 1, wherein said high-contrast grating is planar.

5. The apparatus of embodiment 1, wherein said high contrast grating (HCG) is a subwavelength grating having a period $\Lambda$ which is less than the operating wavelength $\lambda$ in the material above or below the grating.

6. The apparatus of embodiment 1, wherein said metallic layer comprises a layer of Au, Ag, Pt, Pd, Ti, Al, Cu, In, Ni, Zn, Sn, and combinations thereof.

7. The apparatus of embodiment 6, wherein said metallic layer is at, or at least, a thickness of 2 nm.

8. The apparatus of embodiment 1, wherein the inclusion of said deep layer and said metallic layer increases apparatus bandwidth for a given range of reflectivity.

9. The apparatus of embodiment 1, wherein said apparatus is configured for high reflectivity of Transverse-Magnetic (TM) and/or Transverse Electric (TE) optical energies.

10. The apparatus of embodiment 1, wherein said grating elements comprise straight or curved parallel bars of material.

11. The apparatus of embodiment 1, wherein said high-contrast grating elements have a high index of refraction at or above two, while said adjacent material layer is of low index material with an index of refraction below two.

12. The apparatus of embodiment 1, wherein said high-contrast grating is an inverse-tone grating which does not rely on an internal high contrast between said grating elements and said adjacent material layer above and below and compensates for reduced index contrast by relying on initial reflection enhancement upon wave incidence caused by index discontinuity at a transition from said materials above and below said high-contrast grating.

13. The apparatus of embodiment 12, wherein said inverse-tone grating comprises grating elements having a refractive index at or above approximately two, spaces between the grating elements having a low refractive index of approximately one, and an adjacent material layer of a medium to high index material having an index of refraction between two and three, which is less than the refractive index of the grating elements.

14. The apparatus of embodiment 1, wherein said material between the grating elements comprises one or more different materials.

15. An apparatus for optical reflection, comprising: a high-contrast grating (HCG) which is planar; grating elements within said high contrast grating having a grating thickness and width; said grating elements spaced apart from one another with a period, which is subwavelength in the material above and below, to provide reflectance at the desired wavelength; adjacent material layers with medium to high refractive index; said high-contrast grating (HCG) is an inverse-tone high contrast grating in response to selection of said grating thickness, and width as well as material of said grating elements and adjacent material layers; said inverse-tone grating does not rely on internal high contrast between said grating elements and said material layers above and below said high-contrast grating (HCG) and compensates for reduced index contrast by relying on initial reflection enhancement upon wave incidence caused by double index discontinuity at a transition from said adjacent material to said grating elements; said grating elements have a high index of refraction $n_{bar}$ at or above approximately two, and are separated by spaces having an index of refraction which is below two; said adjacent material comprises medium to high index material having an index of refraction $n_{out}$ of at least 1.8; wherein said refractive index of the grating elements and adjacent material follows the relation, $$n_{out} < \frac{\lambda}{\Lambda} < n_{bar},$$

where $\lambda/\Lambda$ is the ratio between a wavelength of operation for said apparatus and grating period.

16. The apparatus of embodiment 15, wherein said inverse-tone high contrast grating is configured for being embedded in said adjacent material layers which comprise relatively high refractive index semiconducting materials.

17. The apparatus of embodiment 15, wherein said inverse-tone high contrast grating is configured for replacing the bottom mirror structure within a Vertical Cavity Surface Emitting Laser (VCSEL).

18. The apparatus of embodiment 15, further comprising: a metallic layer, adjoining one of said adjacent material layers, of a sufficient thickness to provide desired reflection enhancement to said inverse-tone high contrast grating; and wherein said one of said adjacent material layers has a sufficient depth in relation to an operating wavelength, a refractive index of said adjacent material layer, and period of said high-contrast grating.

19. The apparatus of embodiment 15, wherein said sufficient depth of said adjacent material layer is given by the following relation:

$$\text{Sufficient Depth} > \left[\frac{\lambda}{2\pi}\right] / \left[\left(\frac{\lambda}{\Lambda}\right)^2 - n_r^2\right]^{1/2}$$

where $\lambda$ is the wavelength, $n_r$ is the refractive index of the dielectric, and $\Lambda$ is the grating period.

20. The apparatus of embodiment 15, wherein said adjacent material layers comprise one or more different materials.

21. A vertical cavity surface emitting laser (VCSEL) apparatus, comprising: a top mirror; an active region comprising quantum structures; a cavity region surrounding said active region; a high-contrast grating (HCG) having grating elements spaced apart from one another at a grating thickness, width and subwavelength period spacing to provide a desired level of reflectance at the operating wavelength; wherein said high-contrast grating is disposed on opposing sides of said cavity region; an adjacent material layer of a depth of sufficient depth in relation to an operating wavelength, a refractive index of said adjacent material layer, and period of said high-contrast grating; and a metallic layer disposed on said adjacent material layer, and of a sufficient thickness to provide desired reflection enhancement to said second high contrast grating.

22. The apparatus of embodiment 21, wherein said sufficient depth of said adjacent material layer is given by the following relation:

$$\text{Sufficient Depth} > \left[\frac{\lambda}{2\pi}\right] / \left[\left(\frac{\lambda}{\Lambda}\right)^2 - n_r^2\right]^{1/2}$$

where $\lambda$ is the wavelength, $n_r$ is the refractive index of the dielectric, and $\Lambda$ is the grating period.

23. The apparatus of embodiment 21, wherein said top mirror comprises a distributed Bragg reflector (DBR), or another high contrast grating (HCG).

24. The apparatus of embodiment 21: wherein said high-contrast grating (HCG) is an inverse-tone high contrast grating operating in response to selection of said grating thickness, and width, as well as material of said grating elements and adjacent material layers; wherein said inverse-tone grating does not rely on internal high contrast between said grating elements and said adjacent material layer and compensates for reduced index contrast by relying on initial reflection enhancement upon wave incidence caused by double index discontinuity at a transition from said adjacent material above and below said high-contrast grating to said grating elements; said grating elements have a high index of refraction $n_{bar}$ at or above approximately 2, preferably above 2.5, and most preferably at or above 3, and are separated by spaces having an index of refraction which is less than approximately 1.8; said adjacent material comprises medium to high index material having an index of refraction $n_{out}$; wherein said refractive index of the grating elements and adjacent material follows the relation, $$n_{out} < \frac{\lambda}{\Lambda} < n_{bar},$$

where $\lambda/\Lambda$ is the ratio between a wavelength of operation for said apparatus and grating period.

25. The apparatus of embodiment 21, wherein said adjacent material layer comprises one or more different materials.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly

What is claimed is:

1. An apparatus for optical reflection, comprising:

a high-contrast grating (HCG) having grating elements spaced apart from one another at a grating thickness, width, and subwavelength period spacing to provide a desired level of reflectance;

an adjacent material layer as a deep layer, having a sufficient depth in relation to operating wavelength, refractive index of said adjacent material layer, and period of said high-contrast grating; and

TABLE 1

Mode Formulation both Inside and Outside HCG

| | Inside HCG ($-t_g < z < 0$) | | Outside HCG ($0 < z < -t_g$) | |
|---|---|---|---|---|
| ($0 < x < a$) Mode profiles inside inter-bar air-gaps: ($m = 0, 1, 2, \ldots$) | $\epsilon_p \cos(k_{s,m} s/2) * \cos[k_{a,m}(x - a/2)]$ $\exp(\pm j\beta_m z)\hat{1}_\perp$ symmetric around centers of air-gaps: ($x = a/2$) | (1) | $z < -t_g$ Incident plane-wave: | $\exp(-j2\pi z/\lambda)\ddot{\rho}_\perp$ (3) — |
| ($a < x < \Lambda$) Mode profiles inside grating bars: ($m = 0, 1, 2, \ldots$) | $\cos(k_{a,m} a/2)$ $\cos\{k_{s,m}[x - (a + s/2)]\}$ $\exp(\pm j\beta_m z)\ddot{\rho}_\perp$ symmetric around centers of bars: ($x = a + s/2$) | (2) | $z < -t_g$ Reflected modes: ($n = 0, 1, 2, \ldots$) $z > 0$ Transmitted modes: ($n = 0, 1, 2, \ldots$) | $\cos[2\pi n(x - a/2)/\Lambda] *$ (4) $\exp[j\gamma_n (z + t_g)]\ddot{\rho}_\perp$ $\cos[2\pi n(x - a/2)/\Lambda] *$ (5) $\exp(-j\gamma_n z)\ddot{\rho}_\perp$ |
| Dispersion relations inside HCG: $k_{a,m}^2 = (2\pi/\lambda)^2 - \beta_m^2$ $k_{s,m}^2 = (2\pi/\lambda)^2 \epsilon_r - \beta_m^2$ $k_{s,m} \tan(k_{s,m} s/2) = -\epsilon_p k_{a,m} \tan(k_{a,m} a/2)$ | | (6) (7) (8) | Dispersion relations outside HCG: $\gamma_n^2 = (2\pi/\lambda)^2 - (2\pi/\Lambda)^2$ | (9) |

Notations: $\epsilon_p^2 = n_r^2$, $\epsilon_p = n_r^2$ for TM and 1 for TE, $\hat{1}_\perp = \hat{x}$ for TM and $\hat{y}$ for TE.

TABLE 2

Derivation of the Reflectivity Matrix (R) of HCG

Field Overlap Matrices for electric ($E_{n,m}$) and magnetic ($H_{n,m}$) fields $E_{n,m}$ for TM, or $H_{n,m}$ for TE = (10)

$\Lambda^{-1} \int_0^a \epsilon_p \cos(k_{s,m} s/2) \cos[k_{a,m}(x - a/2)] \cos[2\pi n(x - a/2)/\Lambda] dx +$
$\Lambda^{-1} \int_a^\Lambda \cos(k_{a,m} a/2) \cos\{k_{s,m}[x - (a + \Lambda)/2]\} \cos[2\pi n(x - a/2)/\Lambda] dx$ $H_{n,m}$ for TM, or $E_{n,m}$ for TE = (11)

$(\Lambda \eta_{n,m})^{-1} \int_0^a \epsilon_p \cos(k_{s,m} s/2) \cos[k_{a,m}(x - a/2)] \cos[2\pi n(x - a/2)/\Lambda] dx +$
$(\Lambda \eta_{n,m})^{-1} \int_a^\Lambda \cos(k_{a,m} a/2) \cos\{k_{s,m}[x - (a + \Lambda)/2]\} \cos[2\pi n(x - a/2)/\Lambda] dx$

| | | |
|---|---|---|
| Normalized wave impedance: | $\eta_{n,m} = \beta_m/\gamma_n$ for TM, and $\eta_{n,m} = \gamma_n/\beta_m$ for TE | |
| HCG output plane reflection matrix: | $\rho = (H + E)^{-1} (H - E)^{-1}$ | (12) |
| Phase matrix: | $\phi_{m,m} = \exp(-j\beta_m t_g); \phi_{m,k} = 0$ for $m \neq k$ | (13) |
| Normalized entrance impedance: | $Z_{in} = E(I + \phi\rho\phi)(I - \phi\rho\phi)^{-1} H^{-1}$; I = unity matrix | (14) |
| External reflectivity matrix: | $R = (Z_{in} + I)^{-1} (Z_{in} - I)$ | (15) | a metallic layer, adjacent said deep layer, having a sufficient thickness to provide desired reflection enhancement to said high contrast grating;

said high-contrast grating elements have an index of refraction which differs from the material between the grating elements by at least one.

2. The apparatus recited in claim 1, wherein said sufficient depth of said adjacent material layer is given by the following relation:

$$\text{Sufficient Depth} > \left[\frac{\lambda}{2\pi}\right] / \left[\left(\frac{\lambda}{\Lambda}\right)^2 - n_r^2\right]^{1/2}$$

where $\lambda$ is the wavelength, $n_r$ is the refractive index of the dielectric, and $\Lambda$ is the grating period.

3. The apparatus recited in claim 1, wherein said metallic layer has a thickness which equals or exceeds optical skin depth for the material utilized in said metallic layer.

4. The apparatus recited in claim 1, wherein said high-contrast grating is planar.

5. The apparatus recited in claim 1, wherein said high contrast grating (HCG) is a subwavelength grating having a period $\Lambda$ which is less than operating wavelength $\lambda$ in a material above or below the grating.

6. The apparatus recited in claim 1, wherein said metallic layer comprises a layer of Au, Ag, Pt, Pd, Ti, Al, Cu, In, Ni, Zn, Sn, and combinations thereof.

7. The apparatus recited in claim 6, wherein said metallic layer is at, or at least, a thickness of 2 nm.

8. The apparatus recited in claim 1, wherein the inclusion of said deep layer and said metallic layer increases apparatus bandwidth for a given range of reflectivity.

9. The apparatus recited in claim 1, wherein said apparatus is configured for high reflectivity of Transverse-Magnetic (TM) and/or Transverse Electric (TE) optical energies.

10. The apparatus recited in claim 1, wherein said grating elements comprise straight or curved parallel bars of material.

11. The apparatus recited in claim 1, wherein said high-contrast grating elements have a high index of refraction at or above two, while said adjacent material layer is of low index material with an index of refraction below two.

12. The apparatus recited in claim 1, wherein said high-contrast grating is an inverse-tone grating which does not rely on an internal high contrast between said grating elements and said adjacent material layer above and below and compensates for reduced index contrast by relying on initial reflection enhancement upon wave incidence caused by index discontinuity at a transition from said materials above and below said high-contrast grating.

13. The apparatus recited in claim 12, wherein said inverse-tone grating comprises grating elements having a refractive index at or above approximately two, spaces between the grating elements having a low refractive index of approximately one, and an adjacent material layer of a medium to high index material having an index of refraction between two and three, which is less than a refractive index of the grating elements.

14. The apparatus recited in claim 1, wherein said material between the grating elements comprises one or more different materials.

15. An apparatus for optical reflection, comprising:
a high-contrast grating (HCG) which is planar;
grating elements within said high contrast grating having a grating thickness and width;
said grating elements spaced apart from one another with a period, which is subwavelength, to provide reflectance at the desired wavelength;
adjacent material layers, at least above and below said grating elements, having a medium to high refractive index;
said high-contrast grating (HCG) is an inverse-tone high contrast grating in response to selection of said grating thickness, and width as well as material of said grating elements and adjacent material layers;
said inverse-tone grating does not rely on internal high contrast between said grating elements and said material layers above and below said high-contrast grating (HCG) and compensates for reduced index contrast by relying on initial reflection enhancement upon wave incidence caused by double index discontinuity at a transition from said adjacent material to said grating elements;
said grating elements have a high index of refraction $n_{bar}$ at or above approximately two, and are separated by spaces having an index of refraction which is below two;
said adjacent material comprises medium to high index material having an index of refraction $n_{out}$ of at least 1.8;
wherein said refractive index of the grating elements and adjacent material follows a relation, $$n_{out} < \frac{\lambda}{\Lambda} < n_{bar},$$

where $\lambda/\Lambda$ is a ratio between a wavelength of operation for said apparatus and grating period.

16. The apparatus recited in claim 15, wherein said inverse-tone high contrast grating is configured for being embedded in said adjacent material layers which comprise relatively high refractive index semiconducting materials.

17. The apparatus recited in claim 15, wherein said inverse-tone high contrast grating is configured for replacing a bottom mirror structure within a Vertical Cavity Surface Emitting Laser (VCSEL).

18. The apparatus recited in claim 15, further comprising:
a metallic layer, adjoining one of said adjacent material layers, of a sufficient thickness to provide desired reflection enhancement to said inverse-tone high contrast grating; and
wherein said one of said adjacent material layers has a sufficient depth in relation to operating wavelength, refractive index of said adjacent material layer, and period of said high-contrast grating.

19. The apparatus recited in claim 15, wherein said sufficient depth of said adjacent material layer is given by a relation:

$$\text{Sufficient Depth} > \left[\frac{\lambda}{2\pi}\right] / \left[\left(\frac{\lambda}{\Lambda}\right)^2 - n_r^2\right]^{1/2}$$

where $\lambda$ is wavelength, $n_r$ is refractive index of the dielectric, and $\Lambda$ is grating period.

20. The apparatus recited in claim 15, wherein said adjacent material layers comprise one or more different materials.

21. A vertical cavity surface emitting laser (VCSEL) apparatus, comprising:
a top mirror;
an active region comprising quantum structures;
a cavity region surrounding said active region;

a high-contrast grating (HCG) having grating elements spaced apart from one another at a grating thickness, width and subwavelength period spacing to provide a desired level of reflectance at the operating wavelength;

wherein said high-contrast grating is disposed on opposing sides of said cavity region;

an adjacent material layer of a depth of sufficient depth in relation to an operating wavelength, a refractive index of said adjacent material layer, and period of said high-contrast grating; and a metallic layer disposed on said adjacent material layer, and of a sufficient thickness to provide desired reflection enhancement to said high contrast grating.

22. The apparatus recited in claim 21, wherein said sufficient depth of said adjacent material layer is given by a relation:

$$\text{Sufficient Depth} > \left[\frac{\lambda}{2\pi}\right] \bigg/ \left[\left(\frac{\lambda}{\Lambda}\right)^2 - n_r^2\right]^{1/2}$$

where $\lambda$ is wavelength, $n_r$ is refractive index of dielectric, and $\Lambda$ is grating period.

23. The apparatus recited in claim 21, wherein said top mirror comprises a distributed Bragg reflector (DBR), or another high contrast grating (HCG).

24. The apparatus recited in claim 21:

wherein said high-contrast grating (HCG) is an inverse-tone high contrast grating operating in response to selection of said grating thickness, and width, as well as material of said grating elements and adjacent material layers;

wherein said inverse-tone grating does not rely on internal high contrast between said grating elements and said adjacent material layer and compensates for reduced index contrast by relying on initial reflection enhancement upon wave incidence caused by double index discontinuity at a transition from said adjacent material above and below said high-contrast grating to said grating elements;

said grating elements have a high index of refraction $n_{bar}$ at or above approximately 2, and are separated by spaces having an index of refraction which is less than approximately 1.8;

said adjacent material comprises medium to high index material having an index of refraction $n_{out}$;

wherein said refractive index of said grating elements and adjacent material follows a relation, $$n_{out} < \frac{\lambda}{\Lambda} < n_{bar},$$

where $\lambda/\Lambda$ is a ratio between a wavelength of operation for said apparatus and grating period.

25. The apparatus recited in claim 21, wherein said adjacent material layer comprises one or more different materials.

* * * * *